United States Patent
Velichko

(10) Patent No.: US 10,110,840 B2
(45) Date of Patent: Oct. 23, 2018

(54) IMAGE SENSOR PIXELS WITH OVERFLOW CAPABILITIES

(71) Applicant: SEMICONDUCTOR COMPONENTS INDUSTRIES, LLC, Phoenix, AZ (US)

(72) Inventor: Sergey Velichko, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/333,407

(22) Filed: Oct. 25, 2016

(65) Prior Publication Data

US 2018/0115730 A1    Apr. 26, 2018

(51) Int. Cl.
  H04N 5/225        (2006.01)
  H04N 5/232        (2006.01)
  (Continued)

(52) U.S. Cl.
  CPC ....... H04N 5/378 (2013.01); H01L 27/14627 (2013.01); H01L 27/14641 (2013.01);
  (Continued)

(58) Field of Classification Search
  CPC .. H04N 5/378; H04N 5/3559; H04N 5/35581; H04N 5/35554; H04N 5/2253;
  (Continued)

(56) References Cited

U.S. PATENT DOCUMENTS 9,344,647 B2   5/2016   Agranov et al.
9,686,486 B2 * 6/2017   Mauritzson ............ H04N 5/343
(Continued)

FOREIGN PATENT DOCUMENTS

EP      2978021 A2     1/2016

OTHER PUBLICATIONS

Shafie et al., "Non-Linearity in Wide Dynamic Range CMOS Image Sensors Utilizing a Partial Charge Transfer Technique", Sensors, vol. 9, No. 12, Nov. 26, 2009 (Nov. 26, 2009), pp. 9452-9467, XP055443255, DOI: 10.3390.

M. Sakakibara et, ei. "An 83db-Dynamic-Range Single-Exposure Global-Shutter CMOS Image Sensor with In-Pixel Dual Storage"; in ISSCC 2012 Proc., pp. 380-382, Feb. 2012.

(Continued)

Primary Examiner — Hung Lam
(74) Attorney, Agent, or Firm — Treyz Law Group, P.C.; Tianyi He

(57) ABSTRACT

An image sensor pixel may include multiple split photodiodes that are covered by a single microlens. The image sensor may include a charge overflow capacitor coupled to a pixel charge storage within the image sensor via a gain control transistor. The image sensor pixel may have phase detection capabilities in a first mode of operation enabled by comparing phase signals generated from the split photodiodes. The image sensor pixel also may generate and readout image signals simultaneously in both rolling shutter operations and global shutter operations in a second mode of operation. The image sensor pixel may also generate an image using a linear combination of at least two signals read out using the charge overflow capacitor and light flickering mitigation operations. The image may be a high dynamic range image that is generated from at least a low exposure signal and a high exposure signal.

19 Claims, 14 Drawing Sheets

(51) Int. Cl.
- *H04N 5/378* (2011.01)
- *H04N 5/353* (2011.01)
- *H01L 27/146* (2006.01)
- *H04N 5/355* (2011.01)
- *H04N 5/3745* (2011.01)
- *H04N 5/359* (2011.01)

(52) U.S. Cl.
CPC ..... *H01L 27/14656* (2013.01); *H04N 5/2253* (2013.01); *H04N 5/2254* (2013.01); *H04N 5/23245* (2013.01); *H04N 5/3532* (2013.01); *H04N 5/3559* (2013.01); *H04N 5/35554* (2013.01); *H04N 5/35581* (2013.01); *H04N 5/37452* (2013.01); *H04N 5/359* (2013.01)

(58) Field of Classification Search
CPC ............. H04N 5/2254; H04N 5/37452; H04N 5/3532; H04N 5/23245; H04N 5/359; H01L 27/14609; H01L 27/14627

See application file for complete search history.

(56) References Cited

U.S. PATENT DOCUMENTS

| | | |
|---|---|---|
| 2007/0221823 A1 | 9/2007 | Xu et al. |
| 2008/0036888 A1 | 2/2008 | Sugawa et al. |
| 2013/0208154 A1* | 8/2013 | Wang .................... H04N 5/3575 348/280 |
| 2013/0222552 A1 | 8/2013 | Agranov et al. |
| 2014/0071244 A1* | 3/2014 | Hirota ................ H04N 13/0217 348/46 |
| 2014/0246568 A1 | 9/2014 | Wan |
| 2015/0312461 A1 | 10/2015 | Kim et al. |
| 2016/0284759 A1 | 9/2016 | Kimura |
| 2016/0286108 A1* | 9/2016 | Fettig .................... H04N 5/2355 |
| 2017/0324917 A1* | 11/2017 | Mlinar ................ H04N 5/3592 |

OTHER PUBLICATIONS

N. Akahane, et al., "Optimum Design of Conversion Gain and Full Well Capacity in CMOS Image Sensor With Lateral Overflow Integration Capacitor," IEEE Trans. Electron Devices, vol. 56, No. 11, pp. 2429-2435, Nov. 2009.

* cited by examiner

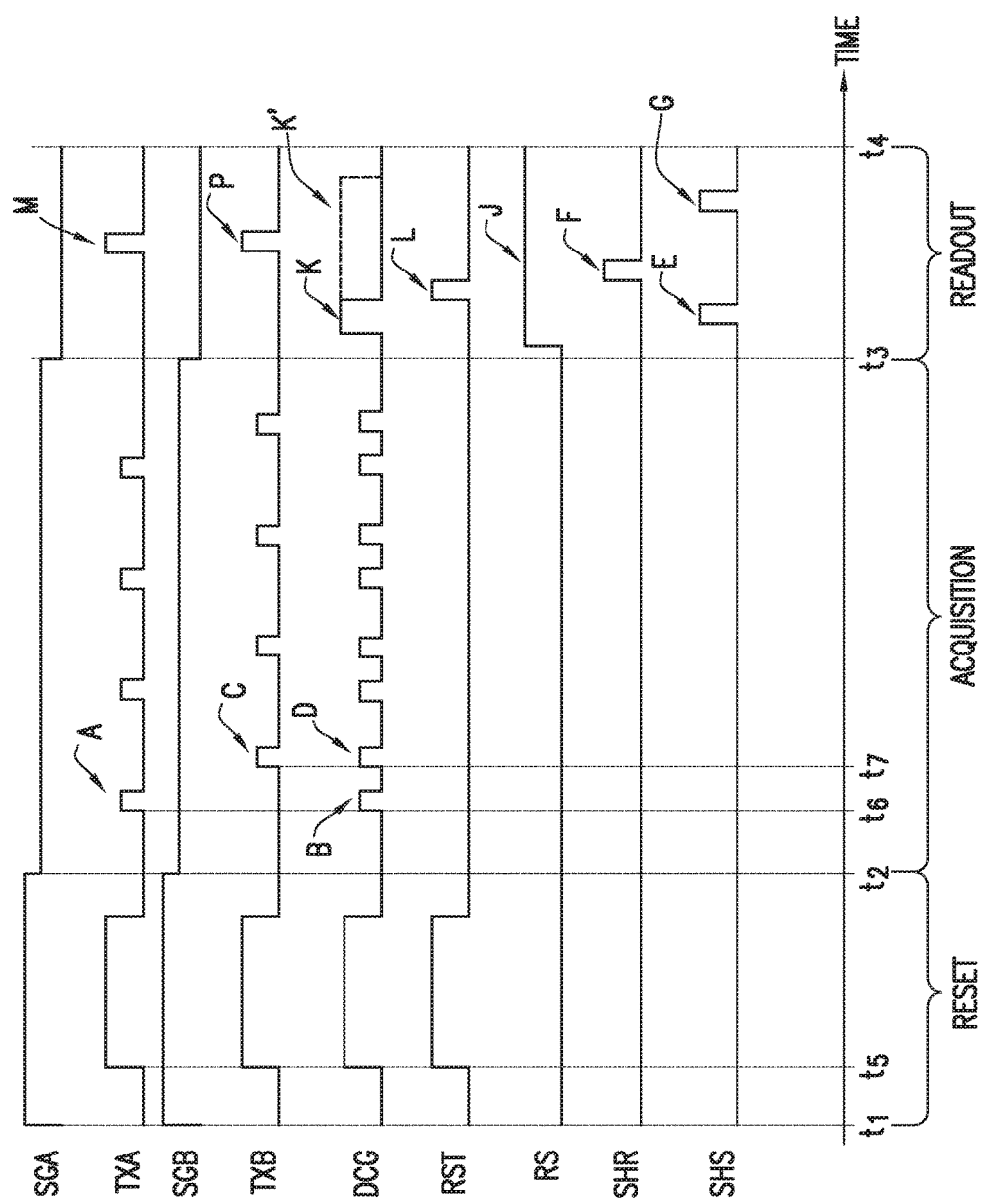

IMAGE SENSOR PIXELS WITH OVERFLOW CAPABILITIES

BACKGROUND

This relates generally to imaging devices, and more particularly, to imaging devices having image sensor pixels with overflow capabilities.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels contain a photodiode for generating charge in response to incident light. Image pixels may also include a charge storage region for storing charge that is generated in the photodiode. Image sensors can operate using a global shutter or a rolling shutter scheme. In a global shutter, every pixel in the image sensor may simultaneously capture an image, whereas in a rolling shutter each row of pixels may sequentially capture an image.

Image sensors may be equipped with multi-exposure high dynamic range (HDR) functionality where multiple images are captured with an image sensor at different exposure times. The images are later combined into a high dynamic range image. In conventional HDR image sensors, a long-exposure image may be sampled during a first readout cycle. Memory buffers are then typically used to store the long-exposure image. While the memory buffers store the long-exposure image, a short-exposure image is generated. The short-exposure image is then sampled in a second readout cycle. After the short-exposure image is sampled, the short-exposure image and the long-exposure image are combined to form an HDR image. However, memory buffers may add additional costs to manufacturing the image sensor (e.g., increased Silicon cost). Additionally, standard HDR image sensor pixels may have other deficiencies such as unwanted saturation of the photodiode caused by bright scenes and inability to detect flickering light.

It would therefore be desirable to be able to provide imaging devices with improved image sensor pixels.

BRIEF DESCRIPTION OF THE DRAWINGS

FIGS. 6A and 6B are timing diagrams for operating the illustrative image sensor pixel shown in FIG. 3 to enable the pair of split photodiodes to have charge overflow and light-flickering mitigation capabilities using two different methods in accordance with an embodiment.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
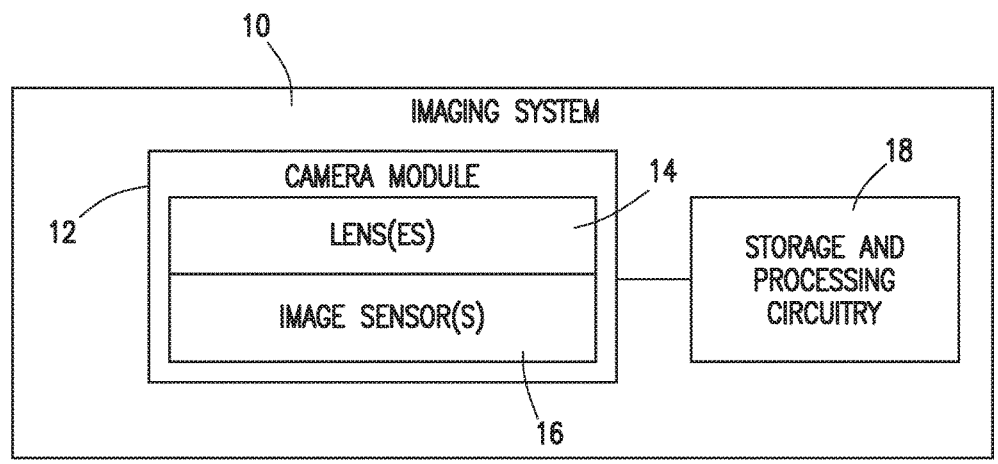
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from the camera module and/or that form part of the camera module (e.g., circuits that form part of an integrated circuit that includes image sensors 16 or an integrated circuit within the module that is associated with image sensors 16). When storage and processing circuitry 18 is included on different integrated circuits (e.g., chips) than those of image sensors 16, the integrated circuits with circuitry 18 may be vertically stacked or packaged with respect to the integrated circuits with image sensors 16. Image data that has been captured by the camera module may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

If desired, image sensor 16 may include an integrated circuit package or other structure in which multiple integrated circuit substrate layers or chips are vertically stacked with respect to each other. In this scenario, one or more of circuitry 26, 28, and 24 may be vertically stacked below array 20 within image sensor 16. If desired, lines 32 and may be formed from vertical conductive via structures (e.g., through-silicon vias or TSVs) and/or horizontal interconnect lines in this scenario.

Image sensors 16 may include one or more arrays 20 of image pixels 22. Image pixels 22 may be formed in a semiconductor substrate using complementary metal-oxide-semiconductor (CMOS) technology or charge-coupled device (CCD) technology or any other suitable photosensitive devices technology. Image pixels 22 may be frontside illumination (FSI) image pixels or backside illumination (BSI) image pixels.

A given image sensor pixel (e.g., an image pixel within image pixels 22, sometimes referred to herein simply as image pixel 22) may include one or more photosensitive regions. For example, image pixel 22 may include one photosensitive region or a pair of photosensitive regions (e.g., a pair of split photodiodes) or more that two photosensitive regions. A microlens (e.g., a portion of lens 14) may be formed over image pixel 22. The microlens may cover the pair of split photodiodes. In other words, all the pixel photodiodes may receive light signals through the same microlens.

The pair of split photodiodes may share readout circuitry for the pixel. Readout circuitry associated with the pair of split photodiodes may include a pixel charge storage region (e.g., a pixel charge storage structure, a floating diffusion region, a pinned storage diode, a storage gate, etc.), and readout transistors (e.g., a source follower transistor, a row select transistor). Each photodiode may have its own dedicated transfer transistor and shutter gate transistor (sometimes referred to herein as shutter gate, anti-blooming transistor or photodiode reset transistor). If desired, the pair of split photodiodes may also share a reset transistor, a gain control transistor (e.g., a dual conversion gain transistor), and an overflow capacitor. If desired, each photodiode may have its own dedicated gain control transistor and overflow capacitor. An isolation region may separate (e.g., be interposed between) the pair of split photodiodes from each other. The isolation region interposed between the split photodiodes may be considered to be part of either or both of the split photodiodes.

This is merely illustrative. If desired, a given image pixel may include more than a pair of photosensitive regions. For example, a given image pixel may include three, four, or any number of suitable split photodiodes. The suitable number of split photodiodes may all share a microlens. In other words, a single microlens may cover all of the split photodiodes. As an example, each of the number of suitable split photodiodes may share certain circuitry (e.g., a gain control transistor, an overflow capacitor, etc.) with one another. As an example, each of the number of suitable split photodiodes may also have certain dedicated circuitry that is not share with any of the other split photodiodes or is only shared with a select number of other split photodiodes that is fewer than the total number of split photodiodes. The specifics of image pixel 22 with split photodiodes are described in more detail in connection with the embodiments that follow.

Figure 2:
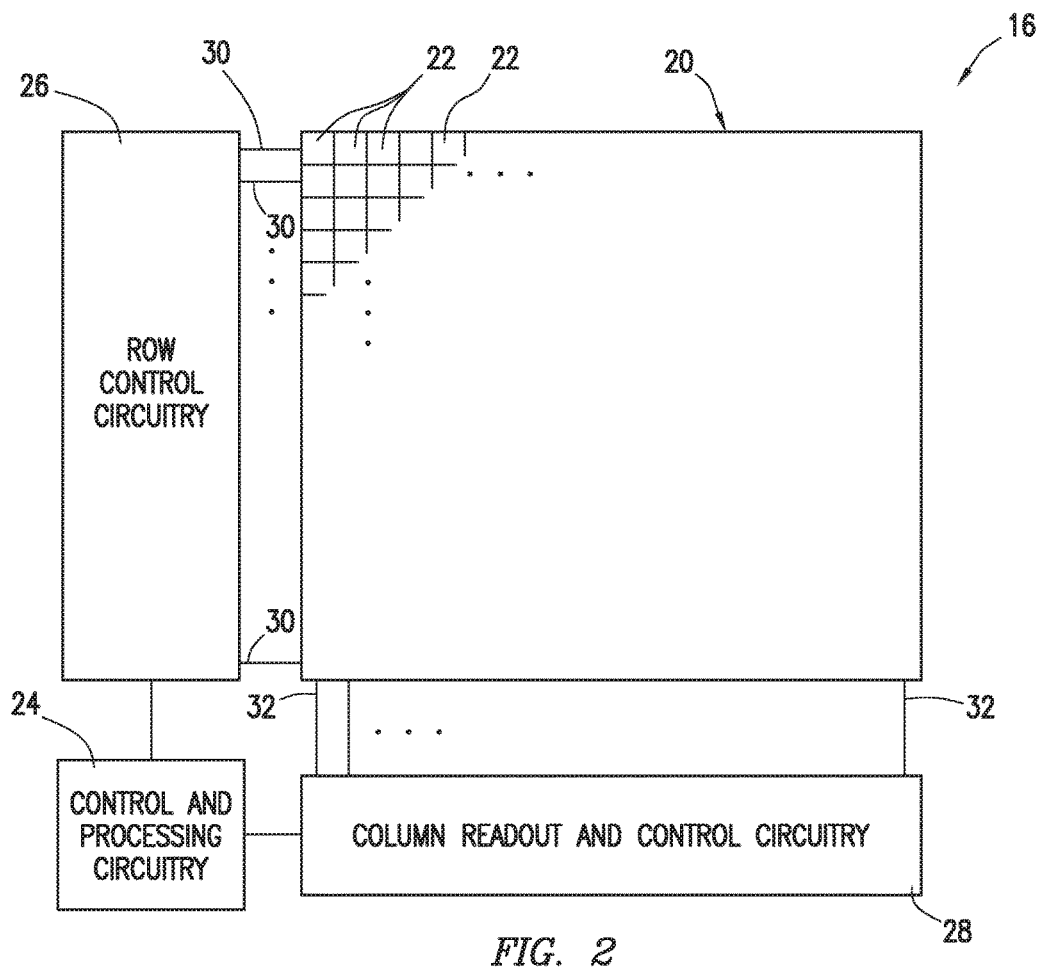
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixel 22 may include more than one photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Figure 3:
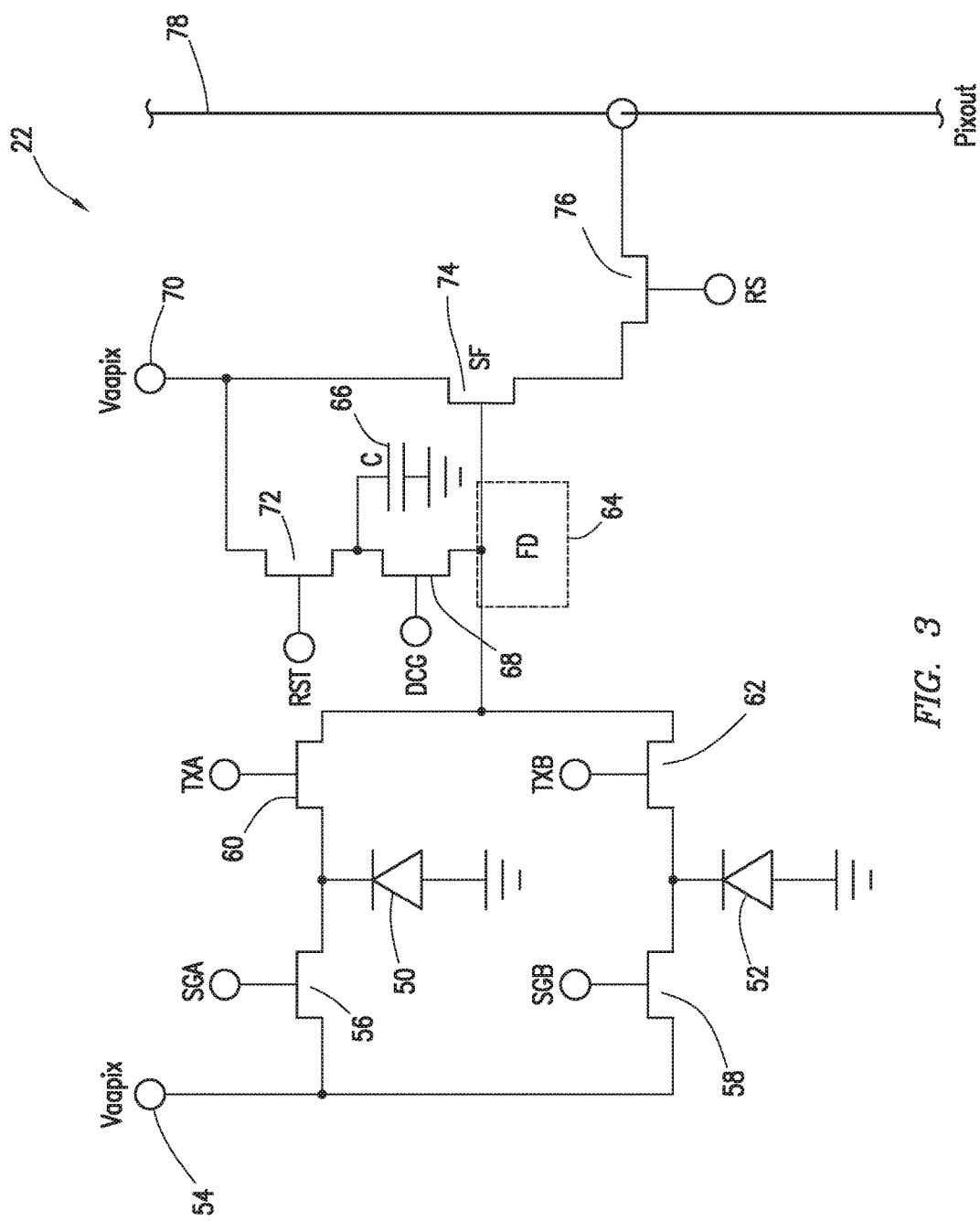
FIG. 3 is a circuit diagram of an illustrative image sensor pixel with a pair of split photodiodes in accordance with an embodiment.

FIG. 3 is a circuit diagram of an illustrative image sensor pixel (e.g., image pixel 22). Pixel 22 may include photosensitive regions 50 and 52 (e.g., split photodiodes 50 and 52, or simply, photodiodes 50 and 52). Photosensitive regions 50 and 52 may be covered by a single microlens. If desired, photodiodes 50 and 52 may be pinned elements (e.g., elements pinned to a pre-determined potential, voltage level, or pinned potential). Photodiodes 50 and 52 may receive incident light over a period of time (i.e., exposure time) and generate an image signal corresponding to the incident light over the exposure time.

In conventional imaging systems, image artifacts may be caused by moving objects, moving or shaking camera, flickering lighting, and objects with changing illumination in an image frame. Such artifacts may include, for example, missing parts of an object, edge color artifacts, and object distortion. Examples of objects with changing illumination include light-emitting diode (LED) traffic signs (which can flicker several hundred times per second) and LED brake lights or headlights of modern cars. Image signals generated with a short integration time and a short exposure time may miss the flickering light (e.g., the blinking light of the LED at a given frequency). However, by spreading the short integration time over a longer exposure time, there is less chance to miss the signal from the flickering light (e.g., pulse light source, LED).

Pixel 22 may be designed to reduce artifacts associated flickering lighting by spreading a short integration time over a longer exposure time. To implement flicker mitigation, photodiodes 50 and 52 may be coupled to voltage source 54 with supply voltage Vaapix through respective shutter gate transistors 56 and 58. When respective control signal SGA and SGB are asserted (e.g., pulsed high), photodiodes 50 and 52 may be respectively reset. When control signal SGA and SGB are deasserted (e.g., pulsed low), photodiodes 50 and 52 may begin to accumulate charge from incident light.

Pixel 22 may include transfer transistors 60 and 62, and pixel charge storage 64 (e.g., pixel charge storage structure 64, floating diffusion region 64, pinned storage diode 64, storage gate 64, etc.). Transfer transistors 60 and 62 may each include a source terminal, a drain terminal, a gate terminal, and a channel region. Floating diffusion region 64 may be a doped-semiconductor region (e.g., a doped silicon region formed in a silicon substrate by ion implantation, impurity diffusion, or other doping techniques) that has charge storage capabilities (e.g., has a capacitance). If desired, floating diffusion region 64 may be a floating diffusion node.

Photodiode 50 may be connected to a first terminal (e.g., a source or drain terminal) of transistor 60. Floating diffusion region 64 may be connected to a second terminal that opposes the first terminal of transistor 60. As an example, if the first terminal is the source terminal, the second terminal may be the drain terminal, or vice versa. Control signal TXA may control a flow of charge across the channel of transistor 60. When control signal TXA is asserted, the image charge stored in photodiode 50 may pass through the channel region of transistor 60 to floating diffusion region 64. Control signal TXA may be subsequently deasserted and photodiode 50 may be reset using control signal SGA. Similarly, photodiode 52 may be coupled to floating diffusion region 64 via transfer transistor 62. Control signal TXB may similarly control a flow of charge across transfer transistor 62.

To improve the charge storage capacity of pixel 22 (e.g., to extend the charge storage capabilities of floating diffusion region 64), overflow capacitor 66 having a capacitance C may be coupled to floating diffusion region 64 via gain control transistor 68. Capacitance C may be much larger than the capacitance associated with floating diffusion region 64, for example. Control signal DCG may control transistor 68 to enable or disable the extension of charge storage capacity of floating diffusion region 64 by respectively asserting or deasserting control signal DCG. Floating diffusion region 64 may also be coupled to voltage source 70 supplying voltage level Vaapix. If desired, voltage source 70 may be the same voltage source as voltage source 54. Alternatively, if desired, voltage source 70 may provide a different voltage level than voltage level Vaapix. Floating diffusion region 64 may be coupled to voltage source 70 via reset transistor 72 and gain control transistor 68. Overflow capacitor 66 and floating diffusion region 64 may be collectively reset to a voltage level (e.g., a voltage level close to Vaapix) by asserting control signals RST and DCG.

Pixel 22 may also include readout circuitry which includes source follower transistor 74 and row select transistor 76. Transistor 76 may have a gate that is controlled by row select control signal RS. When control signal RS is asserted, transistor 76 is turned on and a corresponding signal Pixout (e.g., an output signal having a magnitude that is proportional to the amount of charge at floating diffusion node 64) is passed onto column readout path 78 (sometimes referred to herein as bus line 78 and corresponding to lines 32 in FIG. 2). Conversion of incident light into corresponding image signals at photodiode 50 may occur simultaneously with image signal readout, if desired.

Figure 4:
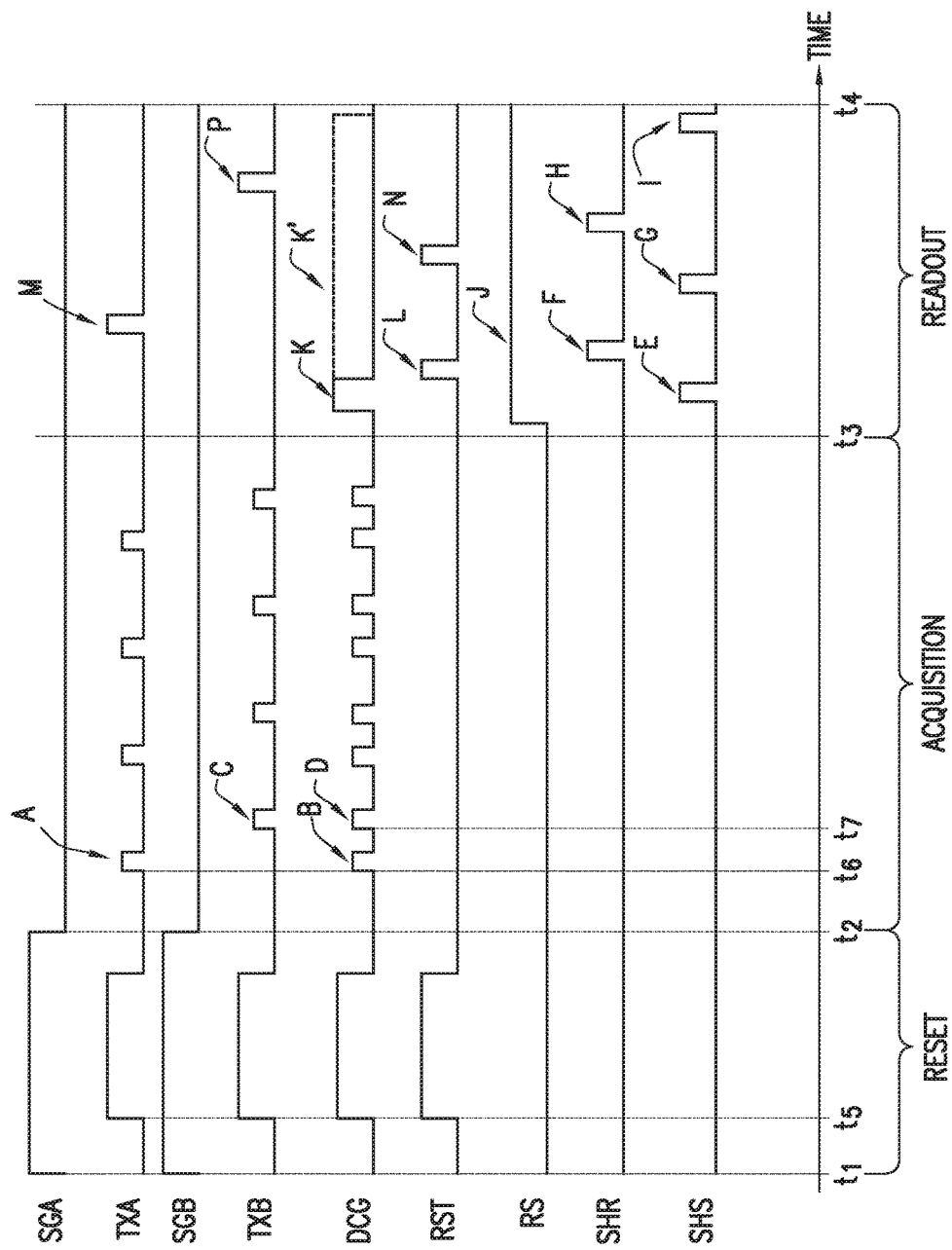
FIG. 4 is a timing diagram for operating the illustrative image sensor pixel shown in FIG. 3 to enable the pair of split photodiodes to have charge overflow capabilities in accordance with an embodiment.

Pixel 22 as shown in FIG. 3 may operate in a charge overflow mode (e.g., operate with an enabled overflow capacitor) to store excess charge that floating diffusion region 64 cannot store (e.g., would normally oversaturate floating diffusion region 64). FIG. 4 shows a timing diagram of operating an illustrative pixel (e.g., pixel 22) in a charge overflow mode of operation.

Between times t1 and t2, a pixel reset period may occur, in which charge storage regions within pixel 22 may be reset close to a supply voltage level (e.g., voltage level Vaapix). During the pixel reset period, transistors 60, 62, 68, and 72 may be simultaneously enabled by asserting respective control signals TXA, TXB, DCG, and RST to reset split photodiodes 50 and 52, floating diffusion region 64, and capacitor 66 (e.g., at time t5). Control signals TXA, TXB, DCG, and RST may be deasserted prior to or at time t2, which starts an acquisition period for pixel 22. Transistors 56 and 58 may be similarly enabled during the pixel reset period (e.g., at time t1) by asserting respective control signals SGA and SGB to reset photodiodes 50 and 52. Transistors 56 and 58 may be deasserted to disconnect photodiodes 50 from voltage source 54 and allow photodiodes 50 and 52 to begin storing charge corresponding to incident light (e.g., at time t2), thus beginning a pixel acquisition period (e.g., a signal acquisition period).

During pixel acquisition period, beginning at time t2 and ending at time t3, incident light may be converted into charge at photodiodes 50 and 52. The converted charge may be stored at (e.g., split amongst) different charge storage regions within pixel 22 (e.g., photodiodes 50 and 52, floating diffusion region 64, and capacitor 66). At time t6, assertions A and B may enable transfer transistor 60 and gain control transistor 69, respectively. By using assertions A and B (sometimes referred to herein collectively as an overflow transfer assertion), some or all of the charge accumulated at photodiode 50 from time t2 to time of the falling edge of assertion A may move into floating diffusion region 64 and overflow capacitor 66. The amount of accumulated charge may be determined by the potential difference between a source-drain terminal of transistor 60 that is connected to photodiode 50 and a source-drain terminal of transistor 60 connected to the floating diffusions region 64 and capacitor 66 combination. Overflow transfer assertions that synchronize a transfer assertion and a gain control assertion will reduce gate dark current contributions (e.g., by using overflow capacitor 66). It may be desirable to realize (e.g., provide) a potential under gain control transistor that is higher than the pinned potential of photodiodes 50 and 52 as pinned elements. Additionally, it may be desirable to realize a large enough potential difference (e.g., 2V, 2.5V, etc.) between the terminals transfer transistors to optimize performance in transferring part or all charge from photodiodes to floating diffusion regions, for example.

Similarly, at time t7, assertions C and D may enable transfer transistor 62 and gain control transistor 68, respectively. By using assertions C and D (e.g., another overflow transfer assertion), some or all of the charge accumulated at photodiode 52 from time t2 to time of the falling edge of assertion C may transfer into floating diffusion region 64 and overflow capacitor 66. The amount of accumulated charge to be transferred may be determined similarly to the process in connection with transistor 60. The transferred charge accumulated at photodiode 52 may be combined with the accumulated charge previously moved using assertions A and B. Additionally, if one or both of photodiodes 50 and 52 accumulate charge above a threshold barrier (e.g., a threshold potential barrier), the accumulated charge above the threshold barrier may overflow into floating diffusion region 64 and optionally capacitor 66 by enabling transistor 68.

Additional assertions of transfer transistors 60 and 62, and gain control transistor 68 (e.g., additional overflow transfer assertions) similar to assertions of A, B, C, and D may take place during the pixel acquisition period. The additional assertions may be further increase the amount of charge stored at the floating diffusion region 64 and capacitor 66. The advantage of operating pixel 22 in charge overflow mode is associated with assertions B, D, and similar additional assertions of control signal DCG. Control signal DCG, which essentially provides floating diffusion region 64 with access to overflow capacitor 66, which may have a substantially larger capacitance (e.g., a capacitance ten times larger, more than ten times larger, with any suitable larger capacitance, etc.) than does diffusion region 64. Overflow capacitor 66 may be a metal-insulator-metal (MiM) capacitor that is outside of an active area of pixel 22 (e.g., outside of the gate layer of pixel 22), for example. As such, overflow capacitor 66 may not consume valuable pixel area (e.g., photosensitive element area).

Pixel 22 may operate with any suitable number additional overflow transfer assertions associated with charges stored at photodiodes 50 and 52 during the signal acquisition period. Each overflow transfer assertion may increase the amount of charge stored at the floating diffusion region 64 and capacitor 66 combination (e.g., may be combined with the charge transferred by all previous overflow transfer assertions).

After performing a suitable number of overflow transfer assertions, the signal acquisition period may end at time t3. At time t3, photodiodes 50 and 52 may store leftover charge that has not moved (or cannot be moved because of a potential barrier) to floating diffusion region 64 and capacitor 66. At time t3, floating diffusion region 64 and overflow capacitor 66 may store a large amount of charge associated with the sum of charge moved by all the overflow assertions during the signal acquisition period.

Time t3 may begin a pixel readout period (e.g., a row readout period) that may start with assertion J, which enables row select transistor 76. Assertion J may begin at the beginning of the pixel readout period and end at the end of the pixel readout period. During the readout period, the charge stored at floating diffusion region 64 and overflow capacitor 66 may be read out first. Then, the charge stored at photodiodes 50 and 52 may be read out one after the other, in any suitable order.

As an example, during the readout period, following assertion J, control signal DCG may be asserted (e.g., assertion k) to collecting both charge stored at overflow capacitor 66 and charge stored at floating diffusion region 64 for readout. In particular, as soon as row select control signal is asserted, charge stored at floating diffusion region 64 may be read out via source follower transistor 74 and carried off pixel 22 via line 78 (as signal Pixout). After assertion k, charge stored at capacitor 66 may first flow to floating diffusion and collectively read out with the charge previously stored at floating diffusion region 64. The collected charge may be sampled and held as a first image signal (e.g., using assertion E).

After all the stored charge from the floating diffusion region 64 and capacitor 66 combination have been read out, control signal RST may be asserted (e.g., using assertion L) to reset overflow capacitor 66. If desired, during this time, floating diffusion region 64 may also be reset by further extending assertion K as shown by assertion K'. The reset state of floating diffusion region 64 may be read out as a first reset signal (e.g., sampled and held as shown by assertion F). Using the first reset signal, the first image signal may be read out using a 3T operation (e.g., using a correlated readout during which the reset readout occurs following the signal readout), in which the first image signal level may be compared to the first reset signal level to remove any errors (e.g., offset errors, systematic noise).

After floating diffusion 64 and capacitor 66 have been reset, charge stored at photodiode 50 may be moved to floating diffusion region 64 via assertion M of control signal TXA. The charge stored at photodiode 50 and moved to floating diffusion region 64 may include any charge accumulated during acquisition between t2 and t3 and modulated by transistor 60 gate potential during this phase. Optionally, if the charge moved to floating diffusion region 64 may oversaturate floating diffusion 64 (e.g., is larger than the well-capacity of floating diffusion 64), control signal DCG may be asserted through extended assertion K'. The charge transferred to floating diffusion 64 (and optionally, capacitor 66) may be read out (as a second image signal) together with the first reset signal readout in a correlated double sampling (CDS) readout. A CDS readout may compare an image signal with a reset signal readout directly before the image signal to eliminate any systematic as well as random noise (e.g., reset noise). As shown by assertion G, the second signal may be sampled and held as part of the CDS readout.

Charge stored at photodiode 52 may be read out in a similar manner as the second signal readout. In particular, assertion N and K' may reset floating diffusion 64 and capacitor 66. The reset state of the floating diffusion region may be read out as a second reset signal readout (e.g., using assertion H). The charge stored at photodiode 52 may then be moved to floating diffusion region 64 and optionally capacitor 66 via assertion P and optionally extended assertion K'. Similarly, the charge stored at photodiode 52 and moved to floating diffusion region 64 may include any charge accumulated during acquisition between t2 and t3 and modulated by transistor 62 gate potential during this phase. During assertion I, the charge from photodiode 52 may be sampled and held as a third image signal. In combination with the second reset signal, the third image signal may be read out as a CDS readout. It may be desirable for the second and third image signals to be read out in a CDS readout because the amount of charge during readout may be very small (e.g., may be susceptible to random noise). Row select control signal may finally be deasserted to end the readout period of pixel 22.

If desired, pixel 22 may include a third split photodiode. In such a scenario, a third reset signal readout and a fourth image signal readout may occur. This is merely illustrative. For example, any suitable number of image signal readouts with corresponding reset signal readouts may be occur with corresponding to each split photodiode.

An overall pixel signal may be generated using a linear combination of all of the image signals. For example, the first, second, and third image signals may be combined to generate an overall image. By using overflow capacitor 66, the dynamic range of pixel 22 may be substantially increased, thereby increasing visibility especially relating to dark scenes in an image. The readout period as described may enable image sensor 16 to operation in rolling shutter mode, for example. HDR image construction may be enabled by using a second such pixel. A first image pixel may generate a long exposure signal and a second image pixel may generate a short exposure signal. The long and short exposure signals may be combined to generate an HDR image. Some memory buffers may be need to store a first signal (e.g., a long exposure signal), until it is ready to be combined with the second signal (e.g., a short exposure signal).

Figure 5:
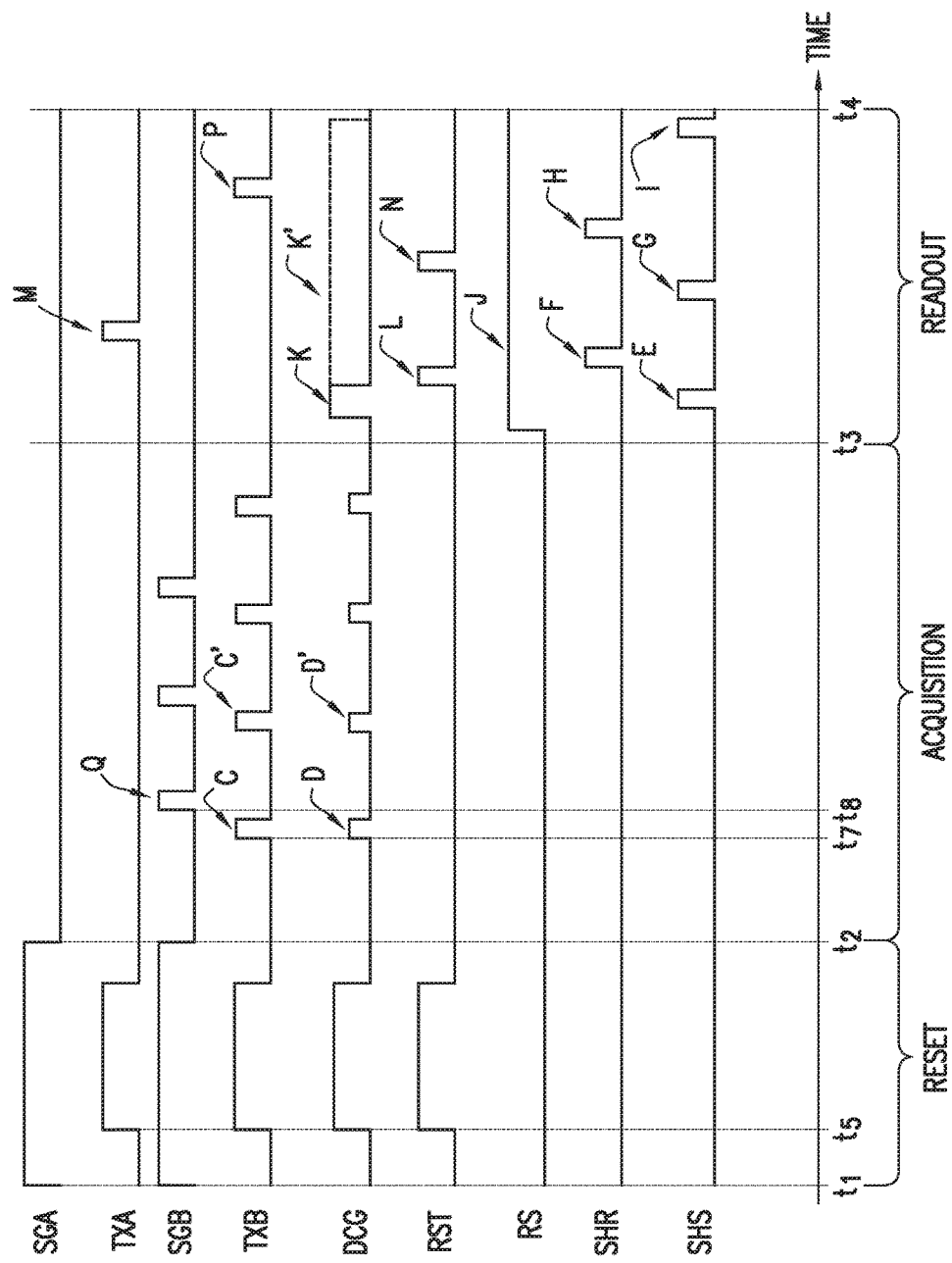
FIG. 5 is a timing diagram for operating the illustrative image sensor pixel shown in FIG. 3 to enable one of the pair of split photodiodes to have charge overflow and light-flickering mitigation capabilities in accordance with an embodiment.

Pixel 22 as shown in FIG. 3 may further operate a given split photodiode in a charge overflow mode with added light-flickering mitigation (LFM) capabilities to store excess charge that floating diffusion region 64 cannot store and reduce image artifacts. FIG. 5 shows a timing diagram of operating an illustrative pixel (e.g., pixel 22) with one split photodiode in a charge overflow and LFM mode of operation.

As shown in FIG. 5, the reset period and readout period of pixel 22 operating a given split photodiode (e.g., photodiode 52) in a charge overflow and LFM mode of operation may be similar to those of pixel 22 operating in a mode described previously in FIG. 4. As such, some details may be omitted as to prevent obscuring the current embodiment. Similarly labeled features (e.g., times t1-t5, assertions E-P, etc.) may be assumed to have similar functions and descriptions as previously described, unless otherwise specified.

After the reset period, the signal acquisition period may begin. During the signal acquisition period, photodiode 50 may accumulate charge without interruption. In other words, control signal TXA (and trivially, control signal SGA) may not be asserted until reading out the charge accumulated at photodiode 50 by first transferring the accumulated charge to floating diffusion region 64 (and optionally overflow capacitor 66). While photodiode 50 is accumulating charge uninterruptedly, photodiode 52 may operate independently to accumulated charge in a charge overflow and LFM mode of operation. As an example, photodiode 50 may operate in a rolling shutter scheme (e.g., a rolling shutter mode).

During the acquisition period, control signals TXB and DCG may simultaneously asserted (i.e. assertions C and D, respectively) to transfer charge accumulated at photodiode 52 during a first integration time (e.g., from time t2 to a falling edge of assertion C). The use of assertions C and D (e.g., an overflow transfer assertion) in FIG. 5 are similar to the use of assertions C and D in FIG. 4 as previously described. Referring to FIG. 5, assertion Q (e.g., an assertion enabling transistor 58 at time t8) may follow assertions C and D to modulate the amount of charge stored at photodiode 52 using voltage source 54 (e.g., resetting the potential of photodiode 52). If desired, assertion Q may be full pulses (e.g., a logic high pulse of a control signal). The combination of assertion Q and C' (an assertion of control signal TXB following assertion Q) may be collectively called a correlated pulse pair when operation in LFM mode. The correlated pulse pair may modulate the amount of charge stored at photodiode 52 by transferring charge to floating diffusion region 64 and capacitor 66 during an overflow transfer assertion and subsequently clearing charge from photodiode 52 by enabling shutter gate 58.

Assertion C and the assertion of control signal SGB during the reset period may also be considered a correlated pulse pair, for example. Additional correlated pulse pairs may follow the correlated pulse pair associated with assertions Q and C'. As such, charge the transferred during a corresponding overflow transfer assertion of each additional correlated pulse pairs may be summed at the floating diffusion and overflow capacitor combination. If desired, the acquisition period may include any suitable number of total correlated pulse pairs.

In applying light flicker mitigation, an exposure period (corresponding to the acquisition period) may include a plurality of integration periods (e.g., charge accumulation periods between each adjacent correlated pulse pairs) that are spread out across the exposure period. This results in an effective discontinuous integration period that overlaps a longer exposure period. By breaking up the effective integration period during an image frame into shorter, non-continuous integration periods that span a longer exposure time, image artifacts caused by moving objects, flickering lighting, and objects with changing illumination may be minimized without compromising pixel integration time (i.e., while maintaining the desired total integration time).

During the readout period as shown in FIG. 5 (with similar assertions as the readout period as shown in FIG. 4), time t3 may begin a pixel readout period (e.g., a row readout period) that may start with assertion J, which enables row select transistor 76. Assertion J may begin at the beginning of the pixel readout period and end at the end of the pixel readout period. During the readout period, the charge stored at floating diffusion region 64 and overflow capacitor 66 may be read out first in a correlated readout. Then, the charge stored at photodiodes 50 and 52 may be read out one after the other, in any suitable order, both using a CDS readout.

For example, a high conversion gain signal may be read out first from the floating diffusion 64 and capacitor 66 combination. The charge stored at photodiode 50 may then be read out and used as a long exposure signal (e.g., a T1 signal). The long exposure signal may suffer some loss of sensitivity because only one split photodiode (e.g., approximately half of the pixel area) is used to accumulate the charge. The charge stored at photodiode 52, floating diffusion 64, and capacitor 66 may then be read out and used as a short exposure signal (e.g., a T2 signal). The long exposure signal and short exposure signal may be combined to generate an HDR image using a single pixel (e.g., pixel 22) without any memory buffers. Duty cycles of the correlated pulse pairs (e.g., assertions Q and C') and the total number of correlated pulse pairs may determine the difference in exposure between a T1 and T2 signal. Factors such as pulse times, pulse strength, and timing in between shutter and transfer may impact the duty cycle. For example, it may be desirable for pulse times to be on a microsecond scale (e.g., 1 microsecond).

Figure 6A:
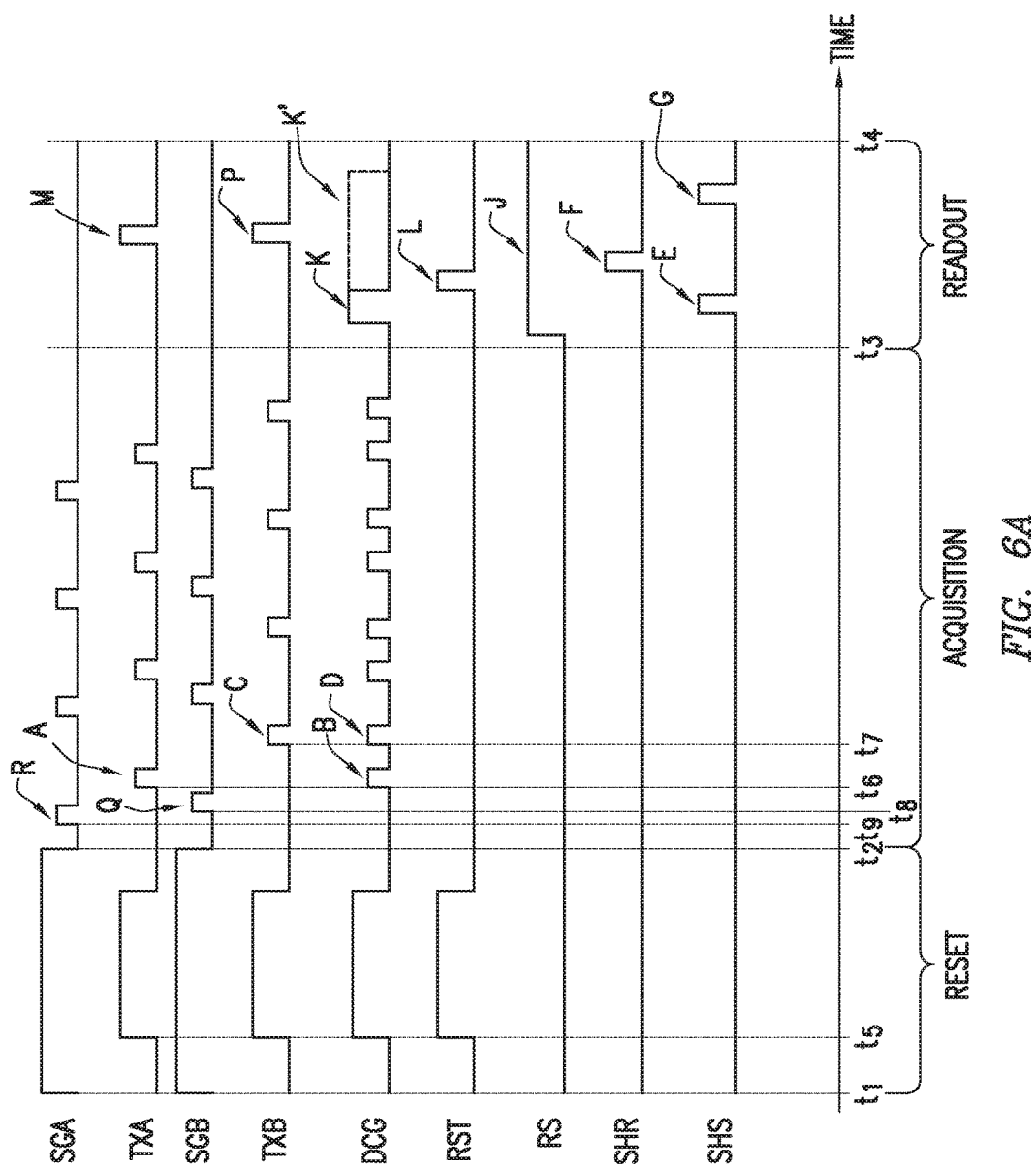

In accordance with an embodiment, pixel 22 may operate both of its split photodiodes in overflow and LFM mode. FIG. 6A shows a timing diagram for operating both photodiodes (e.g., photodiodes 50 and 52) of an illustrative pixel (e.g., pixel 22) in an overflow and LFM mode of operation.

As shown in FIG. 6A, the reset period, acquisition period, and readout period of pixel 22 operating both split photodiodes in a charge overflow and LFM mode of operation may be similar to those of pixel 22 operating in a mode described previously in FIGS. 4 and 5. As such, some details may be omitted as to prevent obscuring the current embodiment. Similarly labeled features (e.g., times t1-t7, assertions A-E, etc.) may be assumed to have similar functions and descriptions as previously described, unless otherwise specified.

After the reset period, the signal acquisition period may begin. During the signal acquisition period, photodiode 50 may use correlated pulse pairs as described in connection to FIG. 4 to enable LFM operation. In particular, control signal SGA may be asserted at time t9 (i.e. assertion R). A charge overflow transfer assertion (e.g., assertions A and B) may follow (e.g., be after) assertion R and be collectively referred to as a first correlated pulse pair of photodiode 50. If desired, assertions A, B, and R may be partial assertions (e.g., asserting a control signal that has a value between a logic high and a logic low) as opposed to full assertions as previously described. Any suitable number of correlated pulse pairs may follow the first correlated pulse pair of photodiode 50.

Similarly, photodiode 52 may independently use correlated pulse pairs to enable LFM operations. In particular, control signal SGB may be asserted at time t8 (i.e. assertion Q). A charge overflow transfer assertion (e.g., assertions C and D) may follow assertion Q and be collectively referred to as a first correlated pulse pair of photodiode 52. If desired, assertions C, D, and Q may be partial assertions (e.g., asserting a control signal that has a value between a logic high and a logic low) as opposed to full assertions as previously described. Any suitable number of correlated pulse pairs may follow the first correlated pulse pair of photodiode 52.

The charges generated by photodiodes 50 and 52 during each integrate time and transferred to the floating diffusion 64 and capacitor 66 combination may be summed (e.g., collectively stored at the floating diffusion region and overflow capacitor). The summed charges stored at floating diffusion region 64 and capacitor 66 may be read out first during the readout period (e.g., beginning with assertion J). Assertion E may be used to sample and hold the summed charges to read out a first image signal (e.g., the summed charges). Assertion L (optionally, in combination with assertion J) may then reset floating region 64 and capacitor 66. The reset state of the floating diffusion region may be sampled using assertion F to generate a first reset signal. The first image signal may be read out in a correlated readout using the first reset signal.

Following the readout of the first reset signal, transfer gates 60 and 62 may be simultaneously asserted (e.g., using assertions M and P) to transfer the stored charges (e.g., leftover charges following a last correlated pulse pair) stored at photodiodes 50 and 52 collectively to floating diffusion region 64. In other words, the leftover charges at photodiodes 50 and 52 may be combined at floating diffusion region 64. Control signal DCG may also be simultaneously asserted, if desired, to increase extend the storage capacities of floating diffusion region 64 as previously described.

The leftover charge or the combined charge transferred to floating diffusion region 64 may be read out in a CDS readout using the first reset signal to generate a second image signal. In particular, assertion G may be used to sample and hold the second image signal. The first image signal may represent a short exposure signal, while the second image signal may represent a long exposure signal. Because both photodiodes (e.g., photodiodes 50 and 52) are used to generate both short and long exposure signals, there is no loss of sensitivity, especially for the short exposure signal, in contrast with the operation described in connection with FIG. 5. As an example, the leftover charges stored at photodiodes 50 and 52 that generate the short exposure signal may fill up to half of each photodiode's well-capacity (e.g., 10 Ke-). The short and long exposure signals may be combined to generate an HDR image.

Charges (e.g., a total charge) stored at a photodiode may be modulated using the potential barriers associated with the corresponding transfer gates and shutter transistor (e.g., transistor 50 and 56 for leftover charges generated at photodiode 50). In other words, the charges stored at the photodiode may be split between leftover charge and overflow charge using correlated pulse pairs. The overflow charge is formed by skimming between the potential barriers below the transfer and shutter transistors, while the leftover charges represent the overflow charges subtracted from the total charges that is left over in the photodiode after each correlated pulse pair. If desired, the pinned potential of the photodiode may be higher than the gate potential of the corresponding transfer gate, which is higher than the gate potential of the shutter gate transistor. The duty cycle between the correlated pulse pairs (e.g., the duty cycle between the falling edges of a transfer gate control signal and a shutter gate control signal) may modulate the photodiode sensitivity, especially in the long exposure signal. In addition, the LFM mode of operation may reduce motion artifacts as previously described.

FIG. 6B shows an alternative embodiment of operating two split photodiodes of an exemplary pixel (e.g., pixel 22) in a charge overflow and LFM mode of operation. As shown in FIG. 6B, shutter gate transistor control signals SGA and SGB may be kept at a same potential through the acquisition period, in contrast with pulsing control signals SGA and SGB as described in FIG. 6A. By maintaining control signals SGA and SGB, there is reduced variation in the potential barrier of the respective shutter gate transistors (e.g., transistors 56 and 58). However, by pulsing signals SGA and SGB as described in FIG. 6A, there may be less drive stress and less leakage or dark current from the respective shutter gate transistors.

Figure 7:
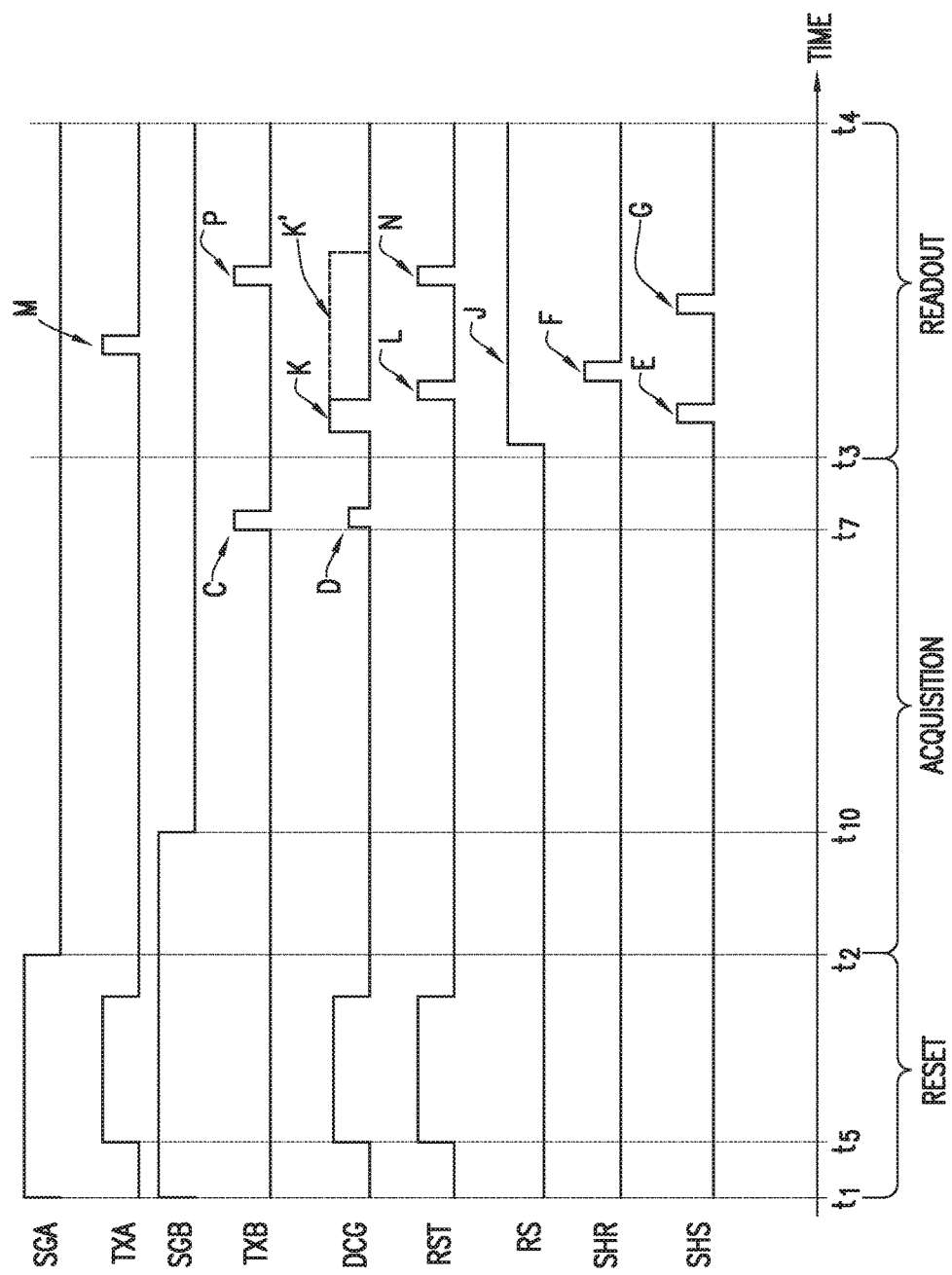
FIG. 7 is a timing diagram for operating the illustrative image sensor pixel shown in FIG. 3 to enable the pair of split photodiodes to operate in global shutter mode and rolling shutter mode in parallel in accordance with an embodiment.

In accordance with an embodiment, pixel 22 may simultaneously operate one of its split photodiodes in a rolling shutter mode and another one of its split photodiodes in a global shutter mode. FIG. 7 shows a timing diagram for operating two photodiodes (e.g., photodiodes 50 and 52) of an illustrative pixel (e.g., pixel 22) simultaneously in respective rolling shutter and global shutter modes.

As shown in FIG. 7, the reset period, acquisition period, and readout period of pixel 22 operating split photodiodes in rolling shutter and global shutter modes in parallel may be similar to those of pixel 22 operating in a mode described previously in FIGS. 4-6. As such, some details may be omitted to prevent obscuring the current embodiment. Similarly labeled features (e.g., times t1-t5, assertions E-G, etc.) may be assumed to have similar functions and descriptions as previously described, unless otherwise specified.

During the reset period, control signals SGA, TXA, SGB, TXB, and RST may be asserted to reset pixel 22. For example, at time t1, control signals SGA and SGB may be used to reset photodiodes 50 and 52, respectively. At time t5, control signals TXA, DCG, and RST may be asserted while continuing to assert control signals SGA and SGB to additionally reset floating diffusion region 64 and overflow capacitor 66. Control signals SGA, TXA, DCG, and RST may be deasserted prior to or at time t2. It may be desirable to continue asserting control signal SGB until time t10 when it may be desirable to begin accumulating charge corresponding to incident light at photodiode 52.

After the reset period and during the signal acquisition period, photodiodes 50 and 52 may begin accumulating charge in parallel. For example, photodiode 50 may begin accumulating charge in a rolling shutter mode (e.g., to prepare for a rolling shutter readout scheme associated with image sensor 16) similar to acquiring image signal using photodiode 50 as described in FIG. 5. In the rolling shutter scheme, each generation of image signals associated with a given pixel within an image sensor may be directly followed by readout of the image signals. Another given pixel within the image sensor may also generate and immediately readout its corresponding image signals (with some temporal overlap with the generation and readout of image signals associated with the given pixel). In other words, image signals for a photodiode are generated and readout in combination.

In a global shutter readout scheme associated with an image sensor (e.g., a global shutter mode), image signals for each image pixel within an image sensor may be generated simultaneously (e.g., in parallel). However, image signals are not readout until the last image signal to be read out is generated. The readout of all of the generated image signals may be performed thereafter, simultaneously.

Photodiode 52 may operate to prepare for a global shutter readout scheme associated with image sensor 16. Time t10 may be selected to accommodate the timing of the overall global shutter readout scheme for other pixels within array 20. At time t7, control signals TXB and DCG may be simultaneously asserted using assertions C and D to transfer charges generated by photodiode 52 during the acquisition period. The charges generated by photodiode 52 may be transferred to floating diffusion region 64 and capacitor 66 to be subsequently readout during the readout period.

The readout period may begin with assertion J as previously described. The charge transferred from photodiode 52 may be read out in a global readout scheme within image sensor 16 to generate a first image signal. The floating diffusion region 64 and capacitor 66 may be subsequently reset using assertion L as previously described. The reset state of floating diffusion 64 may be used to readout the transferred charge in a correlated readout. Assertion M (and optionally, assertion K') may enable charge stored at photodiode 50 to be transferred to floating diffusion region 64 (and optionally, capacitor 66). The charge transferred from photodiode 50 may be read out in a CDS readout to generate a second image signal using a rolling shutter read out scheme.

If desired, a first row of pixels 22 within array 20 may be read out in a rolling shutter readout scheme, while a second row of pixels 22 within array 20 may be read out in a global shutter readout scheme. The operations described in FIG. 7 are merely illustrative. If desired, any suitable modifications may be made. For example, it may be desirable to swap an order of overflow and readout operations for photodiodes 50 and 52.

Figure 8:
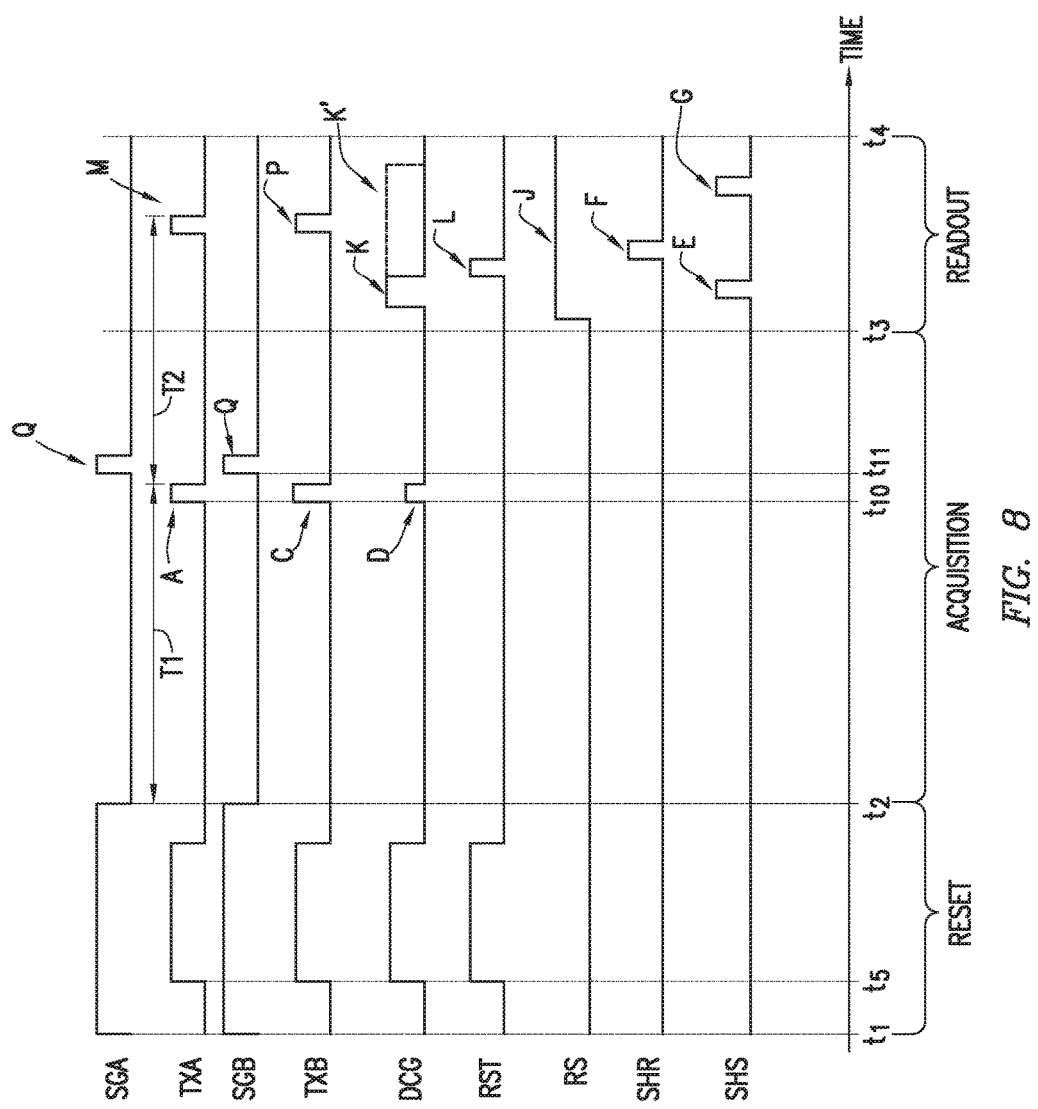
FIG. 8 is a timing diagram for operating the illustrative image sensor pixel shown in FIG. 3 to enable the pair of split photodiodes to have charge overflow and high-dynamic range capabilities in accordance with an embodiment.

In accordance with an embodiment, pixel 22 may simultaneously operate the two split photodiodes in a charge overflow and sequential high dynamic range mode. FIG. 8 shows a timing diagram for operating two photodiodes (e.g., photodiodes 50 and 52) of an illustrative pixel (e.g., pixel 22) in sequential HDR operation with overflow capabilities.

As shown in FIG. 8 the reset period, acquisition period, and readout period of pixel 22 operating split photodiodes in a charge overflow and sequential high dynamic range mode may be similar to those of pixel 22 operating in a mode described previously in FIGS. 4-7. As such, some details may be omitted to prevent obscuring the current embodiment. Similarly labeled features (e.g., times t1-t5, assertions E-G, etc.) may be assumed to have similar functions and descriptions as previously described, unless otherwise specified.

After the reset period, the signal acquisition period may begin. During the signal acquisition period, photodiodes 50 and 52 may accumulate charge in parallel to generate a single long exposure signal (e.g., during period T1). At time t10, assertions A, C, and D may occur simultaneously to transfer the accumulated charge associated with the long exposure signal to floating diffusion region 64 and capacitor 66. In other words, the accumulated charge during long exposure period T1 from photodiodes 50 and 52 are combined to generated generate the long exposure signal. Photodiodes 50 and 52 may accumulate the charge for the long exposure signal from time t2 to the time of the falling edge of assertions A, C, and D, which occur simultaneously.

Assertions Q may optionally occur to reset photodiodes 50 and 52, if desired. At time t11 assertions Q simultaneously enable transistors 56 and 58 to couple photodiodes 50 and 52 to voltage source 54. If assertions Q do not occur, a second exposure period (e.g., a short exposure period T2) to generate a short exposure signal may begin immediately at the falling edges of assertions A and C.

The falling edges of assertions Q may begin the short exposure period, which ends when the respective transfer gates 60 and 62 are enabled and disabled using assertions M and P respectively. According to a desired long exposure period and short exposure period ratio, the readout period may begin at a suitable corresponding time (e.g., at time t3, at assertion J). During the readout period, the charges corresponding to the long exposure signal stored at floating diffusion region 64 and capacitor 66 (by assertion K) may be readout first in a correlated readout using a subsequent reset signal readout. The long exposure signal may be sampled and held using assertion E.

Floating region 64 and capacitor 66 may be reset by assertions L and K. The reset state of the floating diffusion region and capacitor may be readout as a reset signal. The reset signal may be used to provide a correlated readout for the long exposure signal. The reset signal may be also used to provide a CDS readout for the short exposure signal. Subsequent to reset assertion L, assertions M and P may occur simultaneously to transfer the charge accumulated in parallel within photodiodes 50 and 52 to floating diffusion region 64 and optionally, capacitor 66 (by using assertion K'). The transferred charge may generate a short exposure signal. The short exposure signal may be sampled and held using assertion G.

Because both photodiodes are used to generate both the long and short exposure signals, there is no loss of sensitivity as in a previously described mode of operation, in which only one split photodiode of the two split photodiodes is used to generate a short exposure signal (e.g., a low exposure signal). No memory buffers are required for this high dynamic range operation because the long exposure signal is stored in the floating diffusion and capacitor combination as the short exposure signal is generated.

Figure 9A:
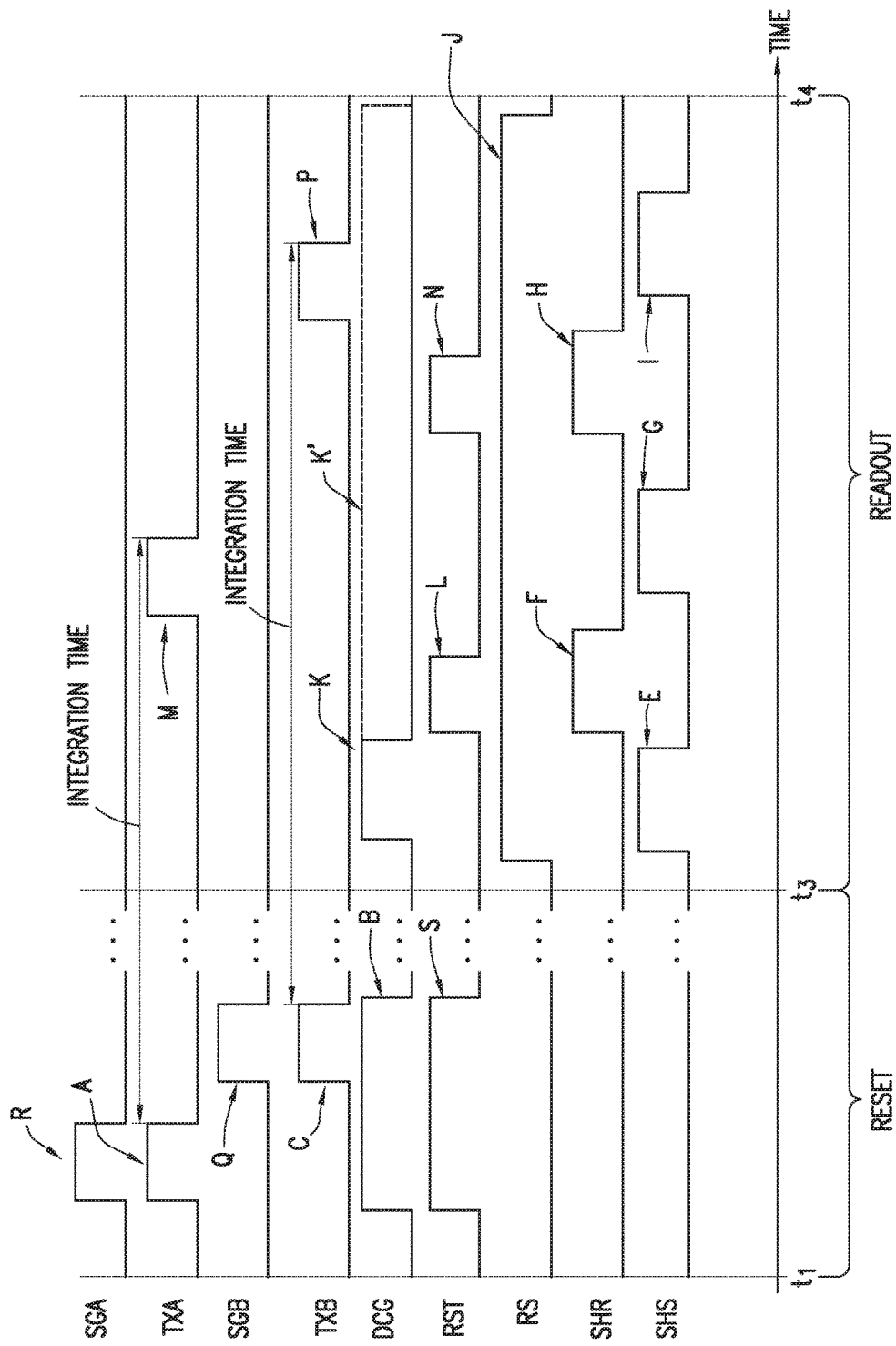
FIGS. 9A-9C are timing diagrams for operating the illustrative image sensor pixel shown in FIG. 3 to enable sequential readout, simultaneous readout, or simultaneous high dynamic range readout in accordance with an embodiment.
Figure 9B:
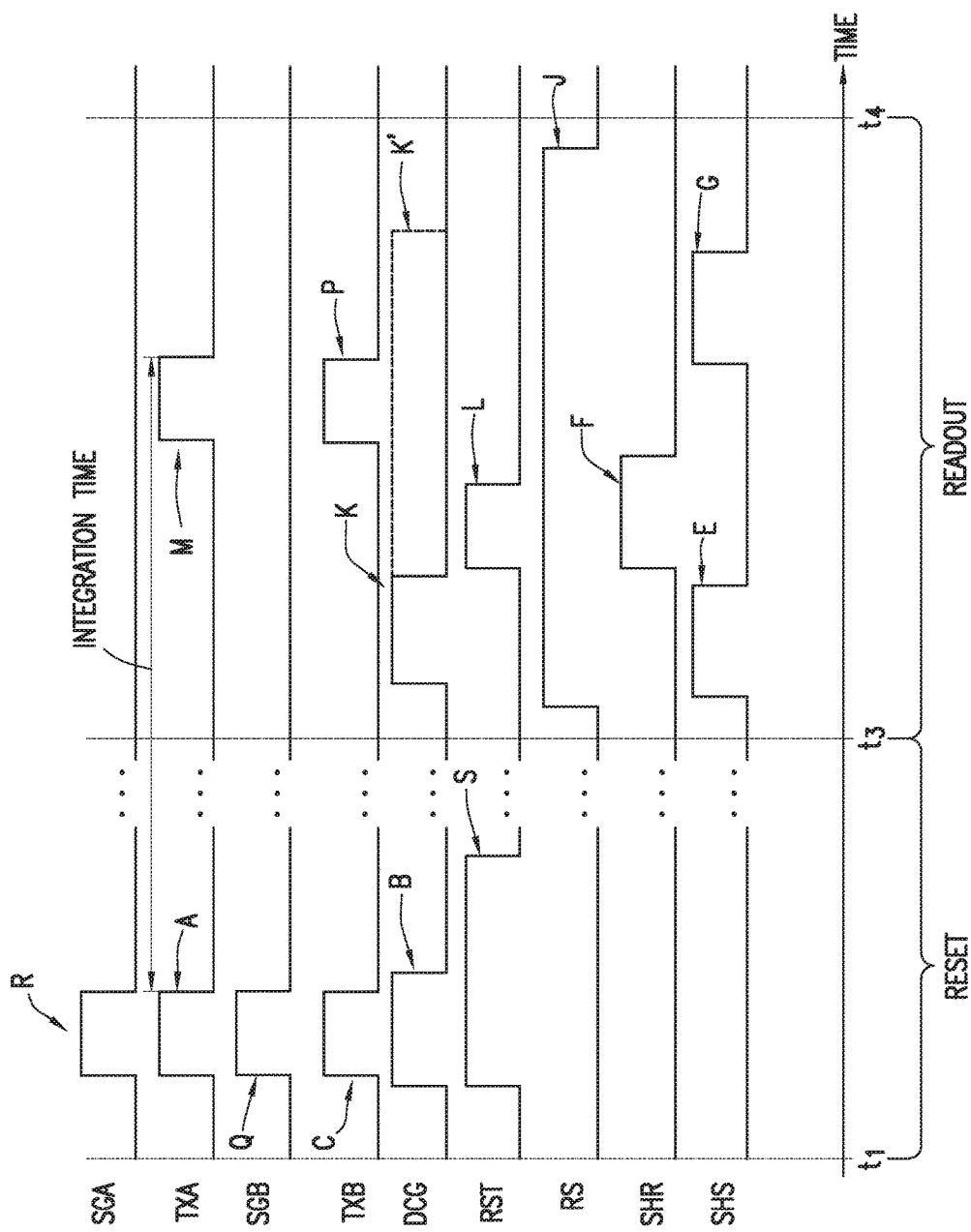
Figure 9C:
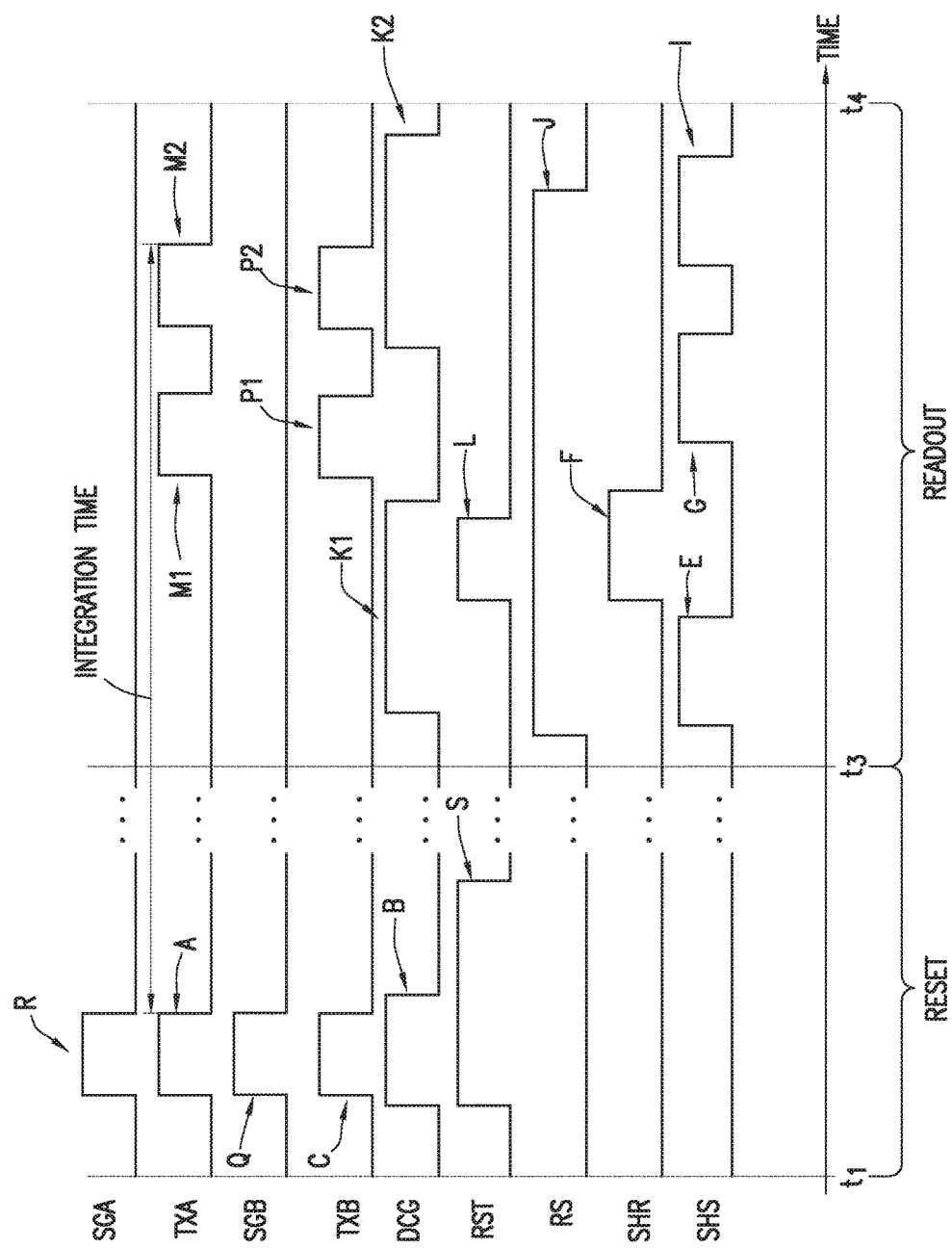

As shown in FIG. 8, a first exposure signal (e.g., a long exposure signal and a second exposure signal (e.g., a short exposure signal) may be accumulated during the acquisition period and partially spanning the readout period. However, if desired, the two exposure signals may be unrelated. If desired, two, three, or more than three signals may be generated during a single readout cycle. FIGS. 9A-9C show timing diagrams of operating an illustrative pixel (e.g., pixel 22) to read out two or more signals in a rolling shutter mode operation. The acquisition period has been omitted from FIGS. 9A-9C as to not unnecessarily obscure the present embodiment.

The reset period and readout period of pixel 22, as shown in FIGS. 9A-9C, operating split photodiodes in rolling shutter mode in parallel may be similar to those of pixel 22 operating in a mode described previously in FIGS. 4-8. As such, some details may be omitted to prevent obscuring the current embodiment. Similarly labeled features (e.g., times t3 and t4, assertions E-G, etc.) may be assumed to have similar functions and descriptions as previously described, unless otherwise specified.

In particular, FIG. 9A shows a timing diagram of operating pixel 22 in a rolling shutter mode while generating three image signals, which include a first image signal stored at the floating diffusion region and overflow capacitor combination, a second image signal from a first split photodiode, and a third image signal from a second split photodiode.

As previously described, at time t1, the reset period may begin. Assertions R and A may reset and begin an integration time for photodiode 50. Assertions Q and C may similarly reset and begin an integration time for photodiode 52. The Assertions A and C may not overlap because photodiodes 50 and 52 may operate independently. The integration time for photodiode 50 may stop at the falling edge of assertion M (sometimes referred to herein as a transfer assertion during readout). The integration time for photodiode 52 may stop at the falling edge of assertion P (sometimes referred to herein as a transfer assertion during readout). The integration times for photodiodes 50 and 52 may be broken up (separated into) charges for suitable first, second, and third image signals.

As an example, a first set of assertions (not shown) may occur to generate a first image signal. The first set of assertions may also include overflow transfer assertions that transfer charge associated with the first image signal to floating diffusion region 64 and overflow capacitor 66. The overflow transfer assertions may occur after reset assertions B and S of control signals DCG and RST. Assertions B and S may occur in parallel with assertions R, A, Q, and C.

The transferred charge associated with the first image signal may be generated using any suitable method (e.g., methods of operation described in FIGS. 4-8). For example, the first image signal may be generated collectively using photodiodes 50 and 52. Alternatively, if desired, the first image signal may be generated using one of photodiodes 50 and 52. This is merely illustrative. In a scenario in which, an illustrative pixel may include more than two split photodiodes, any combination of the split photodiodes may be used to generate the first image signal. The first image signal may be generated in a LFM mode of operation, in a charge overflow mode of operation, any desirable mode of operation, or any suitable (compatible) combination of the modes of operations thereof.

A second set of assertions (not shown) may occur to generate a second image signal associated with photodiode 50. For example, charge may accumulate at photodiode 50 after generating the first image signals. As an example, charge may be left over at photodiode 50 after generating the first image signal. Similarly, a third set of assertions (not shown) may occur to generate a third image signal associated with photodiode 52. For example, charge may accumulate at photodiode 52 after generating the first image signals. As an example, charge may be left over at photodiode 52 after generating the first image signal. The first, second, and third image signals may be readout in a similar manner as described in connection with FIGS. 4 and 5. For example, the readout sequence may include a 3T readout (e.g., correlated readout) for the first image signal and CDS readouts for the second and third image signals.

Because split photodiodes 50 and 52 are covered using a single (e.g., the same) microlens, split photodiodes 50 and 52 may be used to generate angular response. In particular, photodiodes 50 and 52 may be used to generate image signals (sometimes referred to herein as phase signals, when used to perform phase detection). The image signals may be compared to one another to perform phase detection (PDAF) pixel operation. When performing PDAF pixel operations, pixel 22 may have depth-sensing capabilities for detecting distance (e.g., depth) of objects within the image. As an example, the mode of operation described in connection with FIG. 9A may perform phase detection operations. In particular, the second image signal generated using photodiode 50 may be compared to the third image signal generated using photodiode 52 to detect angular response.

FIG. 9B shows a timing diagram of operating pixel 22 in a rolling shutter mode while generating two image signals, which include a first image signal stored at the floating diffusion region and overflow capacitor combination and a second image signal that combines charge generated at first and second split photodiodes.

As previously described, at time t1, the reset period may begin. During the reset period, assertions R, A, Q, and C may occur simultaneously. Furthermore, readout transfer assertions M and P may also occur simultaneously. As such, the integration times for photodiodes 50 and 52 may be the same. A first image signal may be generated similarly as described in connection with FIG. 9A. The simultaneous assertions M and P may be used to generate a second image signal that includes charge from both photodiodes 50 and 52. The readout sequence of FIG. 9B may be similar to the readout period as described in connection with FIGS. 6A, 6B, and 8. Because of the simultaneous occurrence of assertions R and A with Q and C, and assertion M with assertion P, the mode of operation described in FIG. 9B may decrease time for shutter operations and readout operations. In other words, the acquisition period and the readout period may be shortened. It may be desirable to use this mode of operation during high frame rate image generation.

FIG. 9C shows a timing diagram of operating pixel 22 in a rolling shutter mode while generating three image signals, which include a first image signal stored at the floating diffusion region and overflow capacitor combination, a second image signal that is a high conversion gain (HCG) signal, and a third image signal from a low conversion gain (LCG) signal.

As previously described, at time t1, the reset period may begin. A first image signal may be generated similarly as described in connection with FIG. 9A. A second image signal may be generated similarly as described in connection with FIG. 9B with a key difference. Control signal DCG may not be asserted during assertions M1 and P1, which is a pair of simultaneous assertions (similar to assertions M and P in FIG. 9B). Because control signal DCG is not asserted during assertions M1 and P1, the second image signal may be a high conversion gain signal. A third image signal may be generated by simultaneous assertions M2, P2, and K2. Because control signal DCG is asserted (using assertion K2 and accessing a large well-capacity of capacitor 66), the third image signal may be a low conversion gain signal. In other words, whereas in FIG. 9B assertion K' may be optional (as previously described), non-assertion of control signal DCG during assertions M1 and P1, and assertion K2 in FIG. 9C may be required to generate the HCG and LCG image signals. The first, second and third image signals may be subsequently readout using a 3T readout, a HCG readout, and a LCG readout. No reset assertions may be needed between the HCG and LCG readouts because the LCG signal may be much larger than the HCG signal.

The three image signals may be combined (e.g., using a scaled linear combination) to generate a final image. By operating pixel 22 in the mode of operations as described in FIG. 9C, the dynamic range of pixel 22 may be extended. In particular, the in-frame dynamic range may approach theoretical limits. In other words, extending the in-frame dynamic range may not require any memory buffers.

Figure 10:
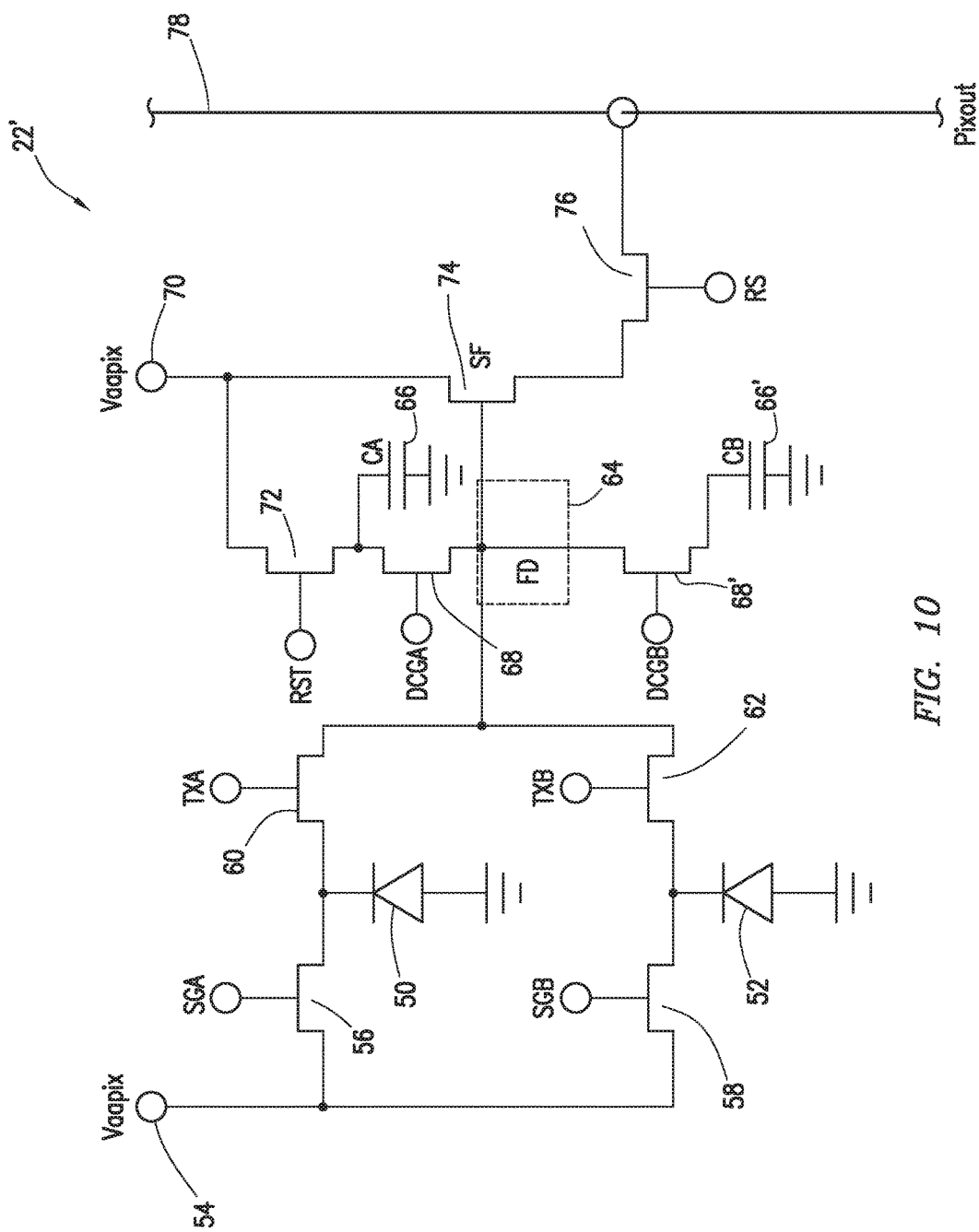
FIG. 10 is a circuit diagram of an illustrative image sensor pixel with a pair of split photodiodes and a corresponding pair of dedicated overflow capacitors in accordance with an embodiment.

In accordance with an embodiment, FIG. 10 shows an illustrative pixel (e.g., pixel 22') that includes two overflow capacitors (e.g., capacitors 66 and 66'). Pixel 22' in FIG. 10 may be similar to pixel 22 in FIG. 3. As such, some details may be omitted to prevent obscuring the current embodiment. Similarly labeled features (e.g., photodiodes 50 and 52, floating diffusion 64, etc.) may be assumed to have similar functions and descriptions as previously described, unless otherwise specified.

As shown in FIG. 10, overflow capacitor 66' may be coupled to floating diffusion region 64 via gain control transistor 68'. Gain control transistor 68 and 68' may be controlled by respective control signals DCGA and DCGB. As an example, capacitor 66' may be formed similar to capacitor 66. For example, capacitor 66 may also be a MiM capacitor that is outside of the gate layer. Two overflow capacitors are shown in FIG. 10. However, this is merely illustrative. If desired, any suitable number of overflow capacitors may be formed. For example, a number of overflow capacitors corresponding to a number of split photodiodes may be formed, a number of overflow capacitors exceeding a number of split photodiodes may be formed, etc.

Overflow transistor 66 may be dedicated to store charge generated at photodiode 50 and overflow transistor 66' may be dedicated to store charge generated at photodiode 52. In other words, overflow charge (e.g., charge that is above a certain potential set by a corresponding transistor, as described in FIG. 6A) from a given photodiode may be stored at a corresponding overflow capacitor. The modes of operations described by the timing diagrams shown in FIGS. 4-9 may be suitably modified to accommodate for the use of capacitor 66'. For example, any overflow transfer assertions of photodiode 52 may use capacitor 66' instead of capacitor 66 as described in FIGS. 4-9.

Figure 11:
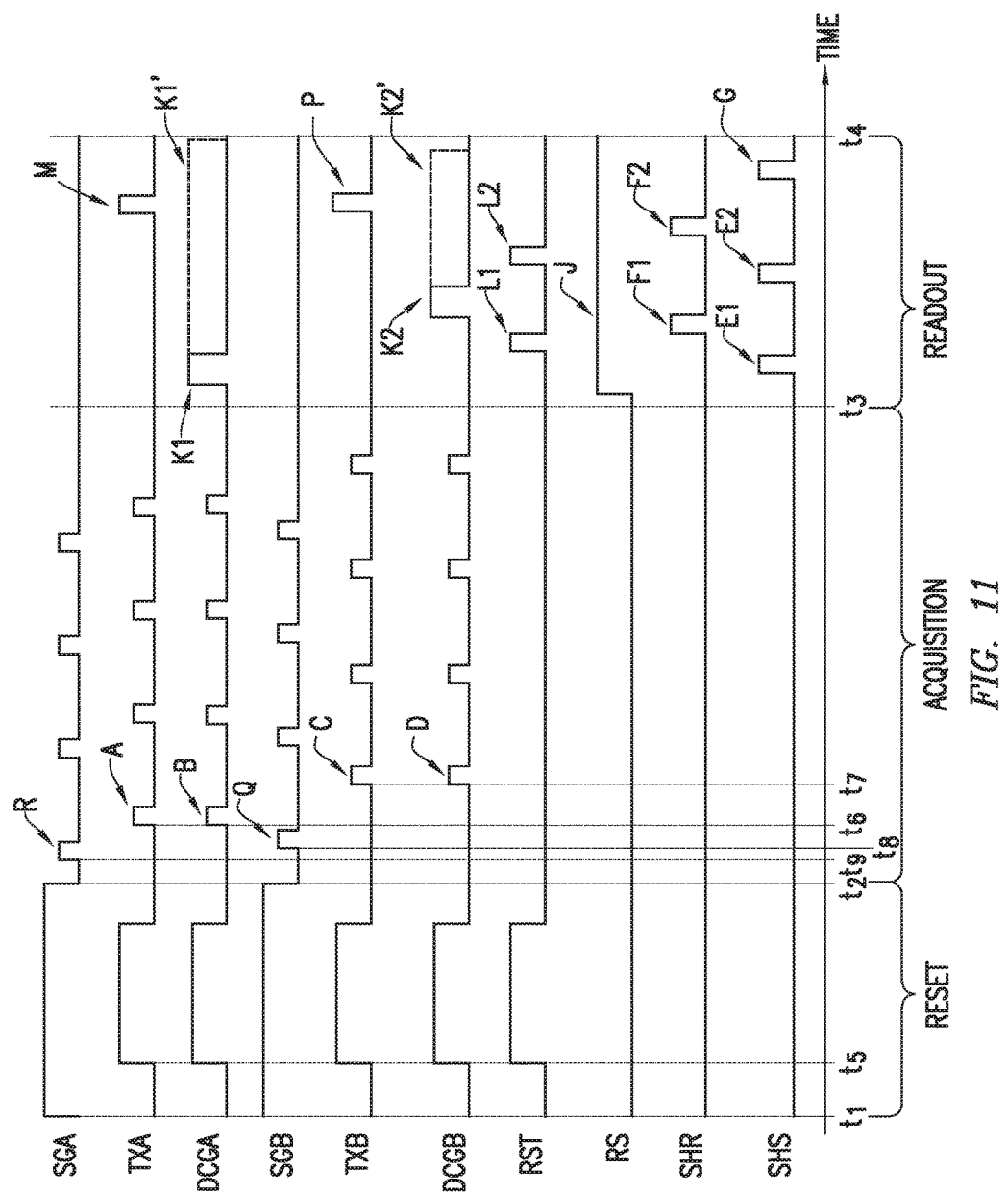
FIG. 11 is a timing diagram for operating the illustrative image sensor pixel shown in FIG. 10 to enable the pair of split photodiodes to have charge overflow and light-flickering mitigation capabilities in accordance with an embodiment.

FIG. 11 shows a timing diagram of operating an illustrative pixel (e.g., pixel 22') in a charge overflow and LFM mode of operation similar to FIG. 6A for pixel 22 while accommodating for capacitor 66' and gain control transistor 68'.

As shown in FIG. 11, the reset period, acquisition period, and readout period of pixel 22' operating split photodiodes with dedicated overflow capacitors may be similar to those of pixel 22 operating in a mode described previously in FIGS. 4-9 (in particular FIG. 6A). As such, some details may be omitted to prevent obscuring the current embodiment. Similarly labeled features (e.g., times t1-t9, assertions A-G, etc.) may be assumed to have similar functions and descriptions as previously described, unless otherwise specified.

The reset period as shown in FIG. 11 may be analogous to that of FIG. 6A. However, control signal DCGA and DCGB may be asserted at time t5 to reset both capacitors 66 and 66'. At time t2, the acquisition period may begin. The acquisition period as shown in FIG. 11 may be analogous to that of FIG. 6A. However, in FIG. 11, assertion B and any subsequent gain control assertions associated with charge from photodiode 50 may be conveyed using control signal DCGA, and assertion D and any subsequent gain control assertions associated with charge from photodiode 52 may be conveyed using control signal DCGB.

The readout period as shown in FIG. 11 may be analogous to that of FIG. 6A. However, in FIG. 11, three image signals may be generated and read out. In particular, a middle exposure signal may be first read out (e.g., associated with assertion E1). A high (e.g., long) exposure signal may then be read out (e.g., associated with assertion E2). A low (e.g., short) exposure signal may be finally read out (e.g., associated with assertion I). The middle exposure signal may be read out in a correlated readout, while the high and low exposure signals may be read out in a CDS readout. In addition, the duty cycles for assertions of control signals SGA and TXA may determine the exposure period ratios for the low and middle exposure signals. Similarly, the duty cycles for assertions of control signals SGB and TXB may determine the exposure period ratios for the middle and high exposure signals.

The middle exposure signal may be a signal stored at capacitor 66. During the readout period, assertion K1 may couple capacitor 66 to floating diffusion region 64 for readout. The high exposure signal may be a signal stored at capacitor 66'. Assertion K2 may similarly couple capacitor 66' to floating diffusion region 64 for readout. However, this is merely illustrative. If desired, the respective duty cycles may be adjusted to generate a suitable set of image signals.

In other words, the readout associated with assertion E as shown in FIG. 6A is performed twice, once with capacitor 66 (e.g., using assertion E1), and a second time with capacitor 66' (e.g., using assertion E2). The readout associated with assertion G in FIG. 11 may be similar to that of FIG. 6A.

In accordance with an embodiment, an illustrative image pixel with split photodiodes (e.g., pixel 22, pixel 22') may operate at least in three modes of operation. In a first mode, the illustrative image pixel may have depth-sensing (e.g., PDAF) capabilities, as described at least in connection with FIG. 9A. In a second mode, the illustrative image pixel may operate both in global shutter and rolling shutter modes simultaneously, as described at least in connection with FIG. 7. In a third mode, the illustrative image pixel may operate in a linear combination mode of operation with charge overflow and LFM capabilities, as described at least in connection with FIGS. 6A and 11.

Figure 12:
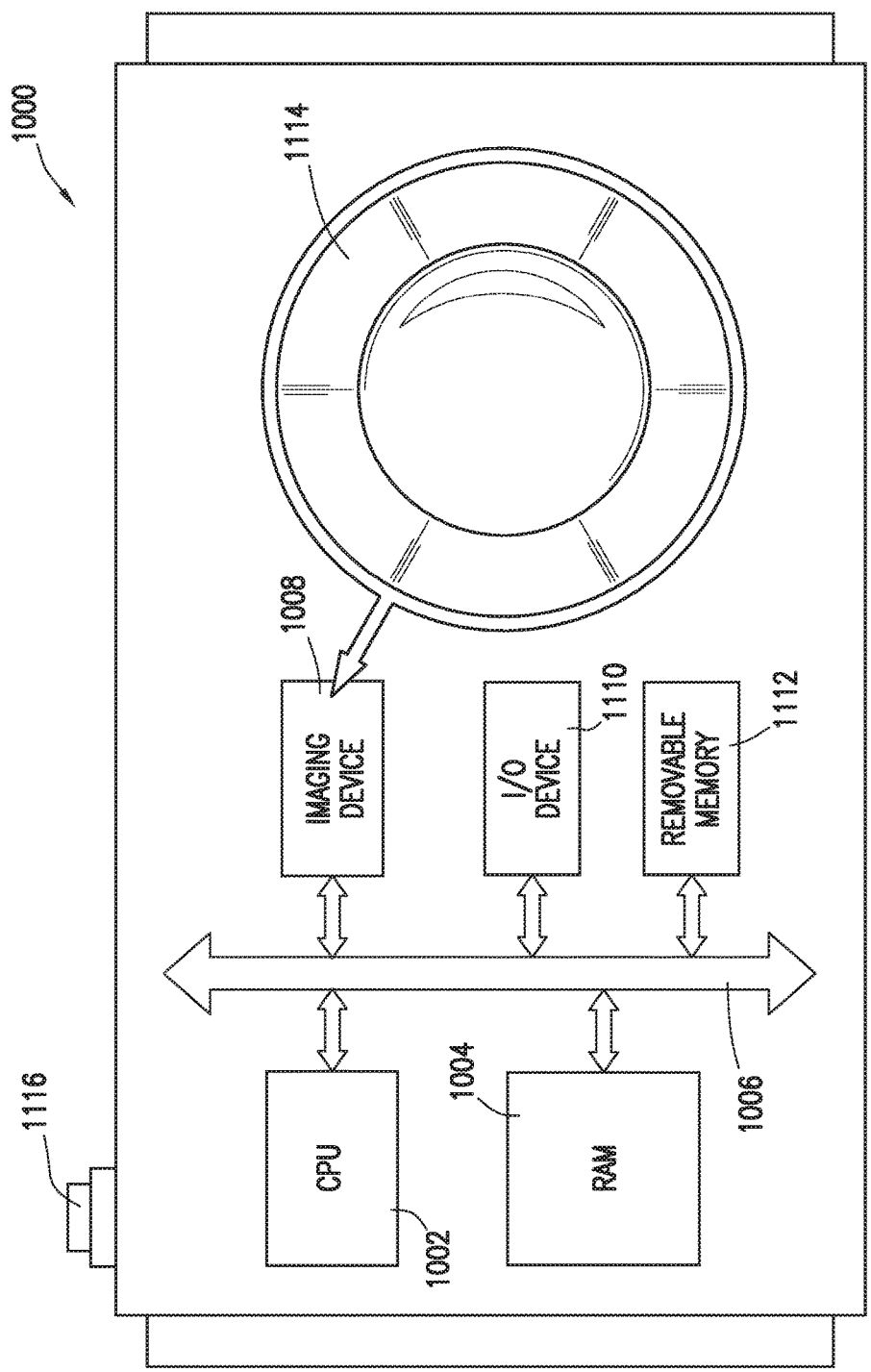
FIG. 12 is a block diagram of a processor system employing the embodiments of FIGS. 1-11 in accordance with an embodiment.

FIG. 12 is a simplified diagram of an illustrative processor system 1000, such as a digital camera, which includes an imaging device 1008 (e.g., the camera module of FIG. 1) employing an imager having pixels as described above in connection with FIGS. 1-11. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel arrays in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods for generating images using image sensor pixels having charge overflow capabilities and split photodiodes.

The image sensor pixel may include first and second split photodiodes that are covered by a single microlens. The image sensor pixel may also include a floating diffusion region and an overflow capacitor that is coupled to the floating diffusion region via a control transistor. The floating diffusion region may be coupled to the first and second split photodiodes via respective first and second transfer transistors.

The image sensor pixel may have depth sensing (e.g., phase detection) capabilities by comparing phase signals generated from the first and second split photodiodes. The image sensor pixel may also operate the first split photodiode to operating a rolling shutter operation and the second split photodiode in a global shutter operation. The image signal generated from (e.g., the charge accumulated at) the first photodiode may occur during an uninterrupted period. The image signal generated from the second photodiode may occur at a suitable time to accommodate for the global shutter readout operations.

The image sensor pixel may also operate to generate a high dynamic range image. The high dynamic range image may be generated using light-flickering mitigation operations and charge overflow capabilities enabled by the overflow capacitor. When at least one of the first and second transfer transistors is asserted (e.g., enabled), the control transistor may be enabled to extend the storage capacitor of the floating diffusion region. Alternatively, an additional overflow capacitor may be coupled to the floating diffusion region via an additional control transistor. With the additional overflow capacitor, the first and second split photodiodes may each have a dedicated overflow capacitor.

The first and second split photodiodes may operate in parallel. A first time period may be used to accumulate charge at the first split photodiode. A second time period may be used to accumulate charge at the second split photodiode. The first and second time period may overlap completely. As such, the charge accumulated at the first split photodiode may be combined with the charge accumulated at the second split photodiode at the floating diffusion region (optionally with the overflow capacitor). The combined charge may be read out simultaneously. Alternatively, the first and second time period may have a certain time offset. The charge accumulated at the first split photodiode and the charge accumulated at the second split photodiode may be readout sequentially.

One, two, three, or more photodiodes may be used in the pixel. One, two, three, or more overflow capacitors may be used in the pixel. A suitable pixel charge storage may be used instead of floating diffusion, for example, a pinned storage diode or a storage gate. Charge that overfills pixel charge storage may overflow into an overflow capacitor or another pixel charge storage. More than one pixel charge storage may be used.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel comprising:
   first and second photodiodes covered by a single microlens, wherein the first photodiode is configured to generate a first signal in response to incident light, wherein the second photodiode is configured to generate a second signal in response to the incident light, and wherein the first signal generated by the first photodiode and the second signal generated by the second photodiode are combined to generate a third signal that is used to generate a high dynamic range image in a mode of operation;
   a pixel charge storage region coupled to the first photodiode via a first transfer transistor and coupled to the second photodiode via a second transfer transistor;
   a capacitor coupled to the pixel charge storage region via a control transistor; and
   a shutter transistor that couples the first photodiode to a voltage source, wherein the first signal is generated using light flickering mitigation operations that alternatingly enable the shutter transistor and the first transfer transistor.

2. The image sensor pixel defined in claim 1, wherein the first signal generated by the first photodiode and the second signal generated by the second photodiode comprise phase signals in an additional mode of operation.

3. The image sensor pixel defined in claim 1, wherein the first signal generated by the first photodiode is generated in global shutter operations and the second signal generated by the second photodiode is generated in rolling shutter operations in an additional mode of operation.

4. The image sensor pixel defined in claim 1, further comprising:
   an additional shutter transistor that couples the second photodiode to the voltage source, wherein the second signal is generated using light flickering mitigation operations that alternatingly enable the second shutter transistor and the second transfer transistor.

5. The image sensor pixel defined in claim 1, wherein the control transistor is asserted when at least one of the first and second transfer transistors is asserted.

6. The image sensor pixel defined in claim 1, wherein the first signal generated by the first photodiode is summed with the second signal generated by the second photodiode at the pixel charge storage region by simultaneously asserting the first and second transfer transistors.

7. The image sensor pixel defined in claim 6, wherein the first and second signals are generated while an overflow signal is read out during a correlated readout operation.

8. The image sensor pixel defined in claim 7, wherein the overflow signal is generated by the first and second photodiodes using light flickering mitigation operations.

9. The image sensor pixel defined in claim 1, further comprising:
an additional capacitor that is coupled to the pixel charge storage region via an additional control transistor, wherein the first signal generated by the first photodiode is stored at the capacitor, and wherein the second signal generated by the second photodiode is stored at the additional capacitor.

10. The image sensor pixel defined in claim 1, wherein the pixel charge storage region is a floating diffusion region.

11. The image sensor pixel defined in claim 1, wherein the pixel charge storage region is a pinned storage diode.

12. The image sensor pixel defined in claim 1, wherein the pixel charge storage region is a storage gate.

13. A method of operating an image pixel that includes a photosensitive region, a microlens formed over the photosensitive region, a charge storage region coupled to the photosensitive region via a transfer transistor, and a capacitor coupled to the charge storage region via a control transistor, the method comprising:
with the photosensitive region, accumulating charge in response to incident light; and
using the transfer transistor, transferring an overflow portion of the charge accumulated with the photosensitive region to the charge storage region and the capacitor by simultaneously asserting the transfer transistor and the control transistor, wherein transferring the overflow portion of the charge accumulated with the photosensitive region to the charge storage region and the capacitor comprises leaving a leftover portion of the charge accumulated with the photosensitive region at the photosensitive region.

14. The method defined in claim 13, wherein the image pixel further includes a shutter transistor, the method further comprising:
asserting the shutter transistor before simultaneously asserting the transfer transistor and the control transistor.

15. The method defined in claim 13, further comprising:
generating a high exposure signal based on the overflow portion of the charge accumulated with the photosensitive region.

16. The method defined in claim 15, further comprising:
generating a low exposure signal based on the leftover portion of the charge accumulated with the photosensitive region.

17. The method defined in claim 16, wherein the image pixel further includes an additional photosensitive region, the microlens formed over the additional photosensitive regions, and an additional transfer transistor that couples the charge storage region to the additional photosensitive region, the method further comprising:
asserting the additional transfer transistor while the transfer transistor is not asserted; and
asserting the control transistor while asserting the additional transfer transistor.

18. A system, comprising:
a central processing unit;
memory;
a lens;
input-output circuitry; and
an image pixel that generates phase signals in a first mode of operation and image signals in a second mode of operation, wherein the image pixel comprises:
a first photosensitive region that generates charge in response to light, wherein a microlens is formed over the first photosensitive region;
a second photosensitive region that generates charge in response to light, wherein the microlens is formed over the second photosensitive region;
a pixel charge storage region;
a capacitor that extends a storage capacity of the pixel charge storage region when a control transistor is asserted; and
readout circuitry that performs readout operations based on the charge generated by the first photosensitive region and the charge generated by the second photosensitive region, wherein the charge generated by the first photosensitive region occurs during a first integration period, wherein the charge generated by the second photosensitive region occurs during a second integration period that only partially overlaps the first integration period, and wherein the readout circuitry is configured to sequentially perform readout operations for the charge generated by the first photosensitive region and the charge generated by the second photosensitive region in a mode of readout operation.

19. The system defined in claim 18, wherein the readout circuitry is configured to simultaneously perform readout operations for the charge generated by the first photodiode and the charge generated by the second photodiode in an additional mode of readout operation.

* * * * *